US006657862B2

(12) United States Patent
Crocker et al.

(10) Patent No.: US 6,657,862 B2
(45) Date of Patent: Dec. 2, 2003

(54) RADIAL FOLDED FIN HEAT SINKS AND METHODS OF MAKING AND USING SAME

(75) Inventors: Michael T. Crocker, Tacoma, WA (US); Daniel P. Carter, Bainbridge Island, WA (US); Tod A. Byquist, Tukwilla, WA (US); Ben M. Broili, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/950,101

(22) Filed: Sep. 10, 2001

(65) Prior Publication Data

US 2003/0048608 A1 Mar. 13, 2003

(51) Int. Cl.⁷ .................................................. H05K 7/20
(52) U.S. Cl. ........................ 361/697; 165/803; 165/185; 165/121; 257/722
(58) Field of Search ................................ 165/80.2, 80.3, 165/121–125, 185; 257/722; 361/694–697, 704, 707, 709–710; D13/179, 184

(56) References Cited

U.S. PATENT DOCUMENTS

| 898,107 A | 9/1908 | Hill |
| 2,337,294 A | 12/1943 | Cooper .......................... 219/10 |
| 3,182,114 A | 5/1965 | Burgess et al. ................ 174/15 |
| 3,187,082 A | 6/1965 | Allison .......................... 174/35 |
| 3,466,909 A | 9/1969 | Weber ............................ 72/68 |
| 3,779,291 A | 12/1973 | Yeo ............................. 140/147 |
| 4,520,541 A | 6/1985 | Miki et al. ................... 29/156.8 |
| 4,557,225 A | 12/1985 | Sagues et al. ............. 128/41.31 |
| 4,688,077 A | 8/1987 | Wakabayashi et al. ........ 357/81 |
| 4,733,293 A | 3/1988 | Gabuzda ........................ 357/81 |
| 4,997,034 A | 3/1991 | Steffen et al. ........... 165/104.34 |
| 5,132,780 A | 7/1992 | Higgins, III .................. 357/81 |
| 5,299,090 A | 3/1994 | Brady et al. ................. 361/703 |
| 5,375,652 A | 12/1994 | Matsunaga et al. ......... 165/80.3 |
| 5,437,327 A | 8/1995 | Chiou .......................... 165/122 |
| 5,505,257 A * | 4/1996 | Goetz, Jr. .................... 165/183 |
| 5,597,034 A | 1/1997 | Barker, III et al. ......... 165/80.3 |
| 5,661,638 A | 8/1997 | Mira ........................... 361/697 |
| 5,761,044 A | 6/1998 | Nakajima .................... 361/719 |
| 5,777,844 A | 7/1998 | Kiefer ......................... 361/704 |
| 5,785,116 A | 7/1998 | Wagner ....................... 165/80.3 |

(List continued on next page.)

FOREIGN PATENT DOCUMENTS

| EP | 0856888 | 8/1998 | |
| EP | 0860874 | 8/1998 | |
| JP | 04-294570 | 10/1992 | |
| JP | 406077677 A | 3/1994 | |
| JP | 2001/102504 | 4/2001 | ........... H01L/23/36 |

OTHER PUBLICATIONS

"High–Performance Fin Design for a Fan–Mounted Heat Sink", *IBM Technical Disclosure Bulletin*, IBM Corp. New York, vol. 37, NR. 11 ISSN: 0018–8689, 417–418 (Nov. 1994).

(List continued on next page.)

Primary Examiner—Gregory Thompson
(74) Attorney, Agent, or Firm—Schwegman, Lundberg, Woessner & Kluth, P.A.

(57) ABSTRACT

Non-prismatic radial folded fin heat sinks include fin arrays comprised of folded fins joined to a thermally conductive central core. The fin arrays can have either a constant or variable bend radius. The non-prismatic radial folded fins can be made by stamping patterns into sheet metal prior to folding the sheet metal in opposite directions at various intervals to form outer and inner folds. By arranging the fins in a non-prismatic radial pattern around the central core, airflow generated by an overhead fan is better utilized, thus improving the cooling effect of the device.

59 Claims, 21 Drawing Sheets

U.S. PATENT DOCUMENTS

| | | | |
|---|---|---|---|
| 5,794,685 A | 8/1998 | Dean | 165/121 |
| 5,920,458 A | 7/1999 | Azar | 361/704 |
| 5,975,194 A | 11/1999 | Wagner | 165/80.3 |
| 6,069,794 A | 5/2000 | Chuang | 361/697 |
| 6,075,702 A | 6/2000 | Gardner et al. | 361/704 |
| 6,152,214 A | 11/2000 | Wagner | 165/121 |
| 6,176,299 B1 | 1/2001 | Hanzlik et al. | 165/80.3 |
| 6,189,601 B1 | 2/2001 | Goodman et al. | 165/80.3 |
| 6,196,300 B1 | 3/2001 | Checchetti | 165/80.3 |
| 6,208,511 B1 | 3/2001 | Bortolini et al. | 361/698 |
| 6,244,331 B1 | 6/2001 | Budelman | 165/80.3 |
| 6,360,816 B1 * | 3/2002 | Wagner | 361/697 |
| 6,374,490 B1 | 4/2002 | Miyahara | 29/890.03 |
| 6,411,510 B2 * | 6/2002 | Sasa et al. | 361/697 |
| 6,419,007 B1 * | 7/2002 | Ogawara et al. | 165/80.3 |
| 2001/0014011 A1 | 8/2001 | Noriyasu et al. | 361/704 |
| 2002/0017378 A1 * | 2/2002 | Hu | 165/80.3 |
| 2002/0018336 A1 | 2/2002 | Liang | 361/697 |
| 2002/0046826 A1 | 4/2002 | Kao | 165/104.33 |

OTHER PUBLICATIONS

Schnurer, G. "Coole Typen Neue CPU–Kuehler Von Madex Und Titan", *CT Magazin Fuer Computer Technik.,* Verlag Heinz Heise GMBH,Hannover,DE NR.11,82–83 (May 22, 2000).

Wagner, G. R., "Optimization of the Arcticooler for Lowest Thermal Resistance in a minimum Volume", *ITHERM 2000. 7TH Intersociety Conference on Thermal and Thermomrchanical Phenomena in Electronic Systems.* Intersociety Conference on Thermal and Thermomechanical Phenomena in Electronic Systems, NY, IEEE, US ISBN: 0–7803–5913–5, (May/2000).

* cited by examiner

RADIAL FOLDED FIN HEAT SINKS AND METHODS OF MAKING AND USING SAME

CROSS REFERENCES

This application is related to the following U.S. patent applications which are assigned to the same Assignee as the present application:

U.S. patent application Ser. No. 09/716,510, filed Nov. 20, 2000, entitled "A High-Performance Fin Configuration For Air-Cooled Heat Dissipation Device;"

U.S. patent application Ser. No. 09/716,877, filed Nov. 20, 2000, entitled "A High Performance Fin Configuration for Air-Cooled Heat Sinks;"

U.S. patent application Ser. No. 09/766,757, filed Jan. 22, 2001, entitled "High-Performance Heat Sink Configurations For Use In High Density Packaging Applications;"

U.S. patent application Ser. No. 09/800,120, filed Mar. 5, 2001, entitled "Radial Folded Fin Heat Sink."

U.S. patent application Ser. No. 08/860,978, filed May 18, 2001, entitled "High Performance Air Cooled Heat Sinks Used in High Performance Packaging Applications;"

U.S. patent application Ser. No. 09/950,898, filed concurrently with this application, entitled "A Manufacturing Process for a Radial Fin Heat Sink;"

U.S. patent application Ser. No. 09/950,100, filed concurrently with this application, entitled "Electronic Assemblies With High Capacity Heat Sinks;" and U.S. patent application Ser. No. 10/047,101, entitled "Heat Sinks and Method of Formation."

TECHNICAL FIELD

This invention relates generally to radial fin heat sinks, and more particularly to radial folded fin heat sinks.

BACKGROUND

Integrated circuit devices (hereinafter "ICs") and other types of electronic components, are becoming increasingly powerful as new features and capabilities are continuously being introduced. This is particularly true regarding the packaging of ICs on substrates, where each new generation of packaging must provide increased performance, particularly in terms of an increased number of components and higher clock frequencies, while generally being smaller or more compact in size. Because these powerful, yet tiny devices are experiencing a relatively large amount of electrical current flow within an extremely small area, a substantial amount of heat is generated during use. If this heat is not continuously removed, these devices may overheat, resulting in damage to the device, the entire system, and/or a reduction in operating performance. As a result, cooling devices are often used in conjunction with electronic components, assemblies and systems.

One commonly used cooling device is a heat dissipation device or heat sink cooling device. This device is normally secured to the top of the electronic component or assembly. In many instances, a fan is used in conjunction with the heat sink to aid in cooling. The heat sink portion of this device typically includes any number of vertically-oriented or prismatic cooling fins or rods that increase the surface area of the heat sink, thus maximizing the transfer of heat from the heat sink device into the surrounding air. The fan, which is typically mounted on top of the heat sink, causes air to move in a manner that helps to cool the fins or rods, thus enhancing their cooling effect. This fan-generated air flow is generally not fully utilized by the heat sink, however, thus limiting the amount of heat that can be removed from the fins or rods, thereby reducing the overall efficiency of the cooling device.

For the reasons stated above, and for other reasons stated below which will become apparent to those skilled in the art upon reading and understanding the present specification, there is a need in the art for a more efficient heat sink.

DETAILED DESCRIPTION

Figure 1:
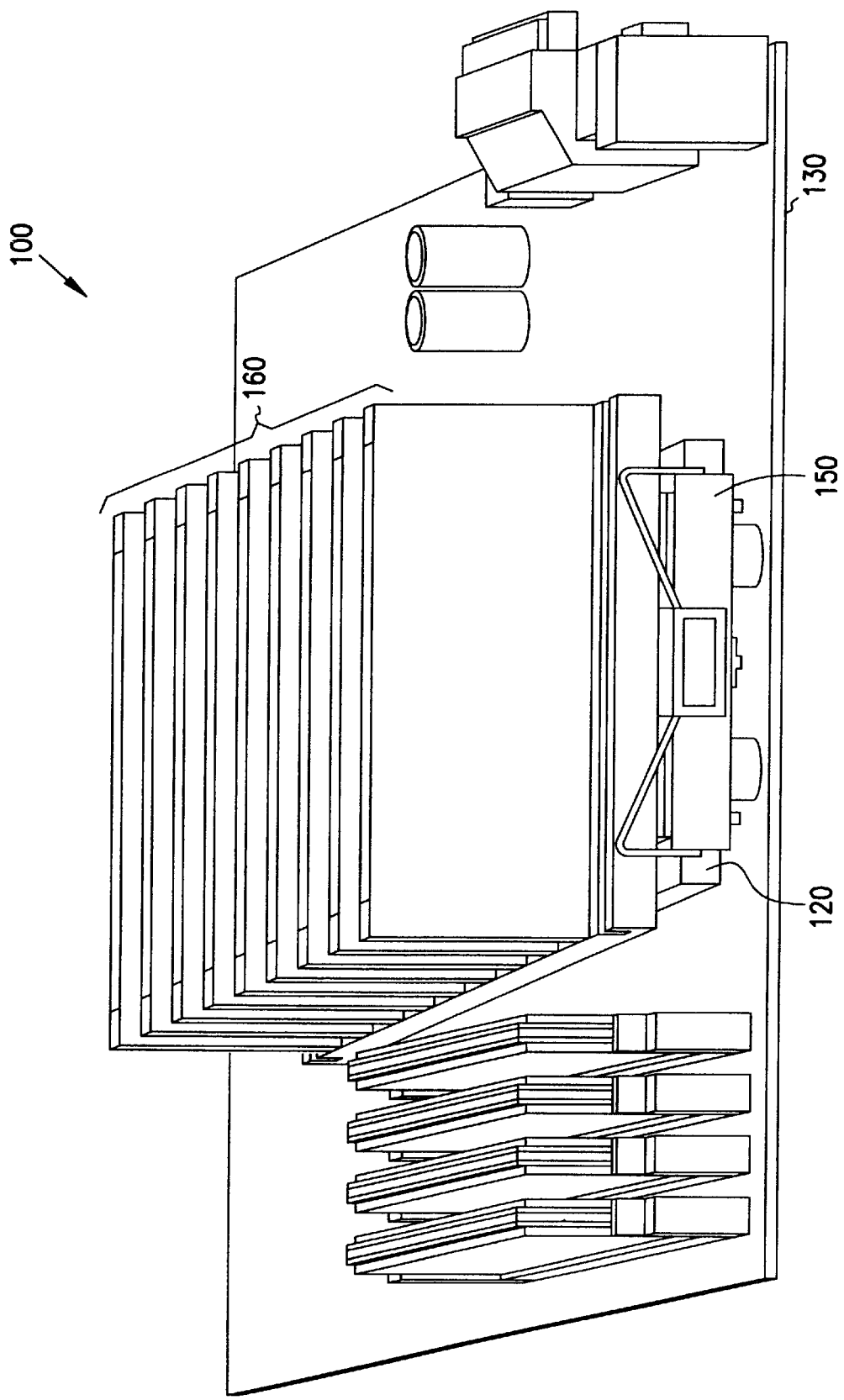
FIG. 1 is an isometric view of a prior art heat sink attached to a microprocessor on an assembled system board.

In the following detailed description, reference is made to the accompanying drawings which form a part hereof, and in which is shown by way of illustration specific embodiments in which the inventions may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit and scope of the present invention. The following detailed description is, therefore, not to be taken in a limiting sense, and the scope of the present invention is defined only by the appended claims, along with the full scope of equivalents to which such claims are entitled.

Non-prismatic radial folded fin heat sinks are described. The fin arrays of the present invention are comprised of folded fins having either a constant or variable outer bend radius. By arranging the fin structures in a non-prismatic radial pattern around a central core, airflow generated by an overhead fan is better utilized, thus improving the cooling effect of the heat sink portion of an electronic assembly.

The detailed description begins with definitions of various terms used throughout the application. This is followed by a brief description of a prior art heat sink. The next section describes various non-prismatic radial folded fin heat sink embodiments. The next section describes methods of manufacturing the heat sinks of the present invention. This section is followed by a brief conclusion.

DEFINITIONS

The term "soldering" as used herein generally refers to the process of joining two metallic surfaces to make an electrical contact by melting solder, i.e., a metallic alloy, across them. Soft soldering includes the joining of metals by fusion of alloys that have relatively low melting points, such as lead-base or tin-base alloys. Hard soldering or "brazing" refers to the joining of two metallic surfaces using nonferrous metal alloys having a melting temperature of at least 450° C. (840° F.), but below the melting point of the metals being joined, such as silver, copper, and nickel-based alloys.

The term "axial" fan, i.e., axial-flow fan, as used herein refers to an air movement device having runner and guide vanes in a cylindrical housing, with air passing through each runner without changing its distance from the axis of rotation. As compared with centrifugal fans, there is no centrifugal effect on the airflow generated. Guide or stator vanes serve to smooth or straighten out the airflow and improve efficiency. The propellers or impellers of an axial fan typically have cross-sections matching those of an aerofoil. An "impinging" axial fan refers to an air movement device oriented such that the axial component of the air flows in a downwardly direction.

The term "centrifugal" fan as used herein refers to an air movement device in, which air is led through an inlet pipe to the center of the impeller, which in turn forces it radially outward into a spiral casing, from which it flows to a discharge pipe.

The term "electronic system" as used herein refers to any product comprising an electronic assembly. An electronic assembly is formed when electronic components, such as integrated circuits (ICs) are assembled into packages by physically and electrically coupling them to a substrate, such as a printed circuit board (PCB). Examples of electronic systems include, but are not limited to, computers (e.g., desktop, laptop, hand-held, server, Internet appliance, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, Motion Picture Experts Group, Audio Layer 3 (MP3) players, and the like.

The term "radial" as used herein means arranged in an outwardly direction from a center area. "Radially-oriented" fins can either be "prismatic" or "non-prismatic." For example, when fins in a heat sink are arranged at an angle to a vertical centerline of a center core, a top view of the fins is "non-prismatic," i.e., more than just the top of each fin can be seen. This is as compared with fins arranged vertically around a center core such that a top view of the fins is "prismatic," i.e., only the top of each fin can be seen.

The terms "swept" or "swept fin geometry" as used herein refers to a non-prismatic radial fin array comprised of fins having a variable bend radius and oriented around a central core such that the fins are substantially or nearly perpendicular to the central core at its latitudinal centerline, i.e., midway between the top and bottom of the core.

The terms "non-swept" or "non-swept fin geometry" as used herein refers to a non-prismatic radial fin array comprised of fins having a constant bend radius and oriented around a central core such that the fins are substantially or nearly perpendicular to the central core at its top or upper surface.

Prior Art Heat Sink

FIG. 1 provides a perspective view of a prior art heat sink 100 mounted on a microprocessor 120 of an assembled system board 130. The heat sink 100 comprises a flat base plate 150 and an array of vertically-oriented fins 160 extending to the edge of and substantially perpendicular to the base plate 150. The base plate 150 typically has a larger footprint size than the microprocessor 120 located below, as shown in FIG. 1. Consequently, the outermost portion of the base plate 150 that is not directly in contact with the microprocessor 120 may have a significantly lower temperature than the portion of the base plate 150 that directly contacts the microprocessor 120, thus compromising the effectiveness of the heat sink 100.

Furthermore, although the sizes of packaged processors are decreasing, the amount of heat generated by these components is increasing. Increasing the heat dissipation capabilities of the prior art heat sink 100 would require enlarging the surface area of the base plate 150 and/or the array of fins 160. This in turn would result in consuming more system board real estate, which is generally not a viable option in an environment where system packaging densities are increasing with each successive, higher performance, microprocessor generation. Consequently, the prior art heat sink 100 is generally not generally used for dissipating heat from newer, high-powered components.

Non-Prismatic Radial Folded Fin Heat Sink Embodiments

Figure 2:
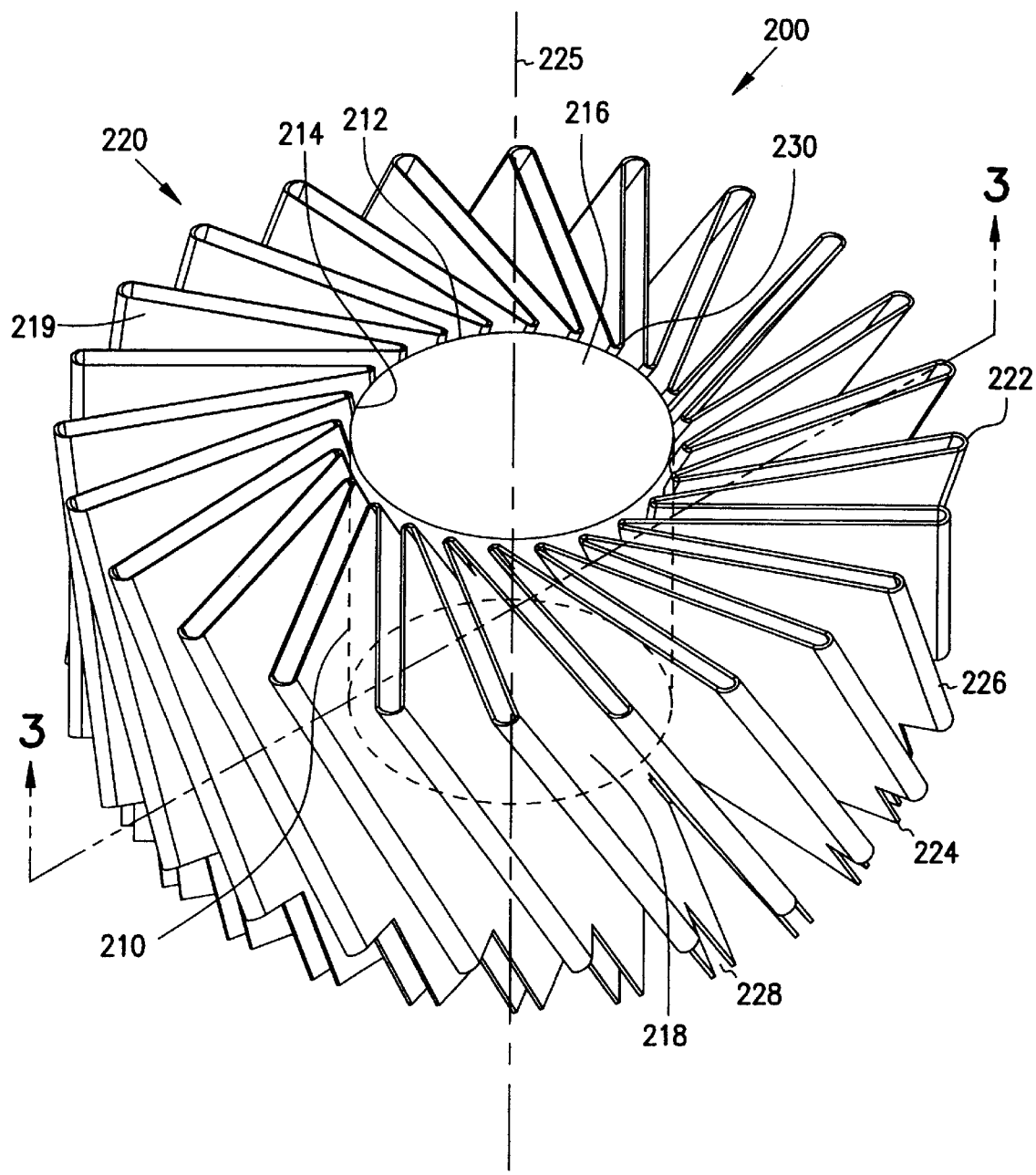
FIG. 2 is an isometric view of one embodiment of a non-prismatic radial folded fin heat dissipation device or heat sink (hereinafter "non-prismatic heat sink") according to the present invention.

FIG. 2 illustrates one embodiment of a "non-swept" non-prismatic radial heat sink having folded fins (hereinafter "non-swept heat sink") 200 according to the present invention. The non-swept heat sink 200 comprises a thermally conductive core 210 and a plurality of non-prismatic, non-swept folded fins 219 arranged in a corrugated or "accordion" style to form a non-swept fin array 220. In this embodiment, the core 210 has an outer surface 212, an inner surface 214, a top surface 216 and a bottom surface 218 oriented about a core longitudinal axis 225 as shown. The core 210 further has a core latitudinal centerline 280 at its midpoint (line 3—3) as shown. In the embodiment shown in FIG. 2, each individual fin 219 is contiguous or integral with the adjacent fin 219 and further has an upper portion 222 and a lower portion 224. Each fin 219 further has a folded outer portion 226 that extends from the upper portion 222 to a notched opening or vent 228 located in the lower portion 224 as shown. Each individual fin 219 further has a folded inner portion 230 secured to the core 210.

The core 210 can be a hollow or solid body having any suitable configuration, as is known in the art, including cylindrical, conical, square, rectangular, or any other similar shape that facilitates mounting of the non-swept heat sink 200 onto a microprocessor. The core 210 can be of any suitable size. In a particular embodiment, the core 210 has a cylindrical shape with a diameter of between about 28 and 32 mm and a height of between about 45 and 47 mm, depending on the size of the processor. The core 210 can further include heat transport mediums such as one or more heat pipes, a liquid, a thermo-siphon, and/or any other such heat transport medium known to enhance heat dissipation, as is known in the art. Material choices for the core 210 include any type of thermally conductive material such as a metallic material, e.g., aluminum, copper, and so forth.

In most embodiments, the non-swept fin array 220 is comprised of a single ribbon of material folded at various intervals to create a series of folded outer portions 226 and folded inner portions 230. In another embodiment, only some of the fins 219 are connected in this manner, such that two or more ribbons of material are used to form the non-swept fin array 220. In yet another embodiment, a plurality of individual fins 219 comprise the non-swept fin array 220. The non-swept fin array 220 can have virtually any type of outer shape, including, but not limited to, circular, square, rectangular, elliptical, conical, and so forth. The non-swept fin array 220 is normally vented in order to avoid build-up of undesirable back pressure during use. In the embodiment shown in FIG. 2, the notched vent 228 located in the bottom portion 224 of each fin provides the requisite ventilation, although the invention is not so limited. Any type of ventilation means that aids in reducing pressure build-up can be used.

The fins 219 can be of any suitable thickness and size and made from the same types of materials noted above for the core 210, i.e., any type of material known to conduct heat, such as aluminum, copper, and so forth. Each fin 219 can have the same dimensions as shown herein, although the invention is not so limited. In an alternative embodiment, the fins 219 are each of varying dimensions. In one embodiment, there are two fin sizes used, with every other fin 219 being of the same size, such as is shown in U.S. patent application Ser. No. 09/800,120, supra. In one embodiment, any suitable type of sheet metal is used, which has the advantage of allowing a relatively high number of fins to be in contact with the central core, as compared to folded fins made with other types of materials. In an exemplary embodiment, aluminum fins made from sheet metal are used together with a copper core 120. In a particular embodiment, the fins are all about the same height and length and are each about 0.25 cm (about 0.1 in) thick.

Any number of fins 219 may comprise an array, depending on the particular application. In one embodiment, about 20 to 30 fins 219 comprise the non-swept fin array 220, although the invention is not so limited. In fact, unlike extruded fins, fin density for folded fins is generally not limited due to limitations associated with the fin itself, e.g., aspect ratio, etc., but is limited primarily by the manufacturing process being used, the size of the core 210, and so forth. As a result, the fin density in a given array size can be much higher for folded fins as compared with extruded fins.

After assembly, the non-swept fin array 220 is oriented to the core 210 such that the folded inner portions 230 are necessarily the portion of each fin 219 that contacts the core 210 at an angle long its length. (This is unlike the assembly in U.S. application Ser. No. 09/800,120 in which the folded portions of the fins form the top and bottom surfaces of a prismatic fin array). The non-swept fin array 220 can be secured to the core 210 in any suitable manner. In one embodiment the inner folded portions 230 are brazed to the outer surface 212 of the core 210 in any suitable type of non-prismatic radial pattern. The use of brazing to join the fins to the core has the advantage of using relatively low temperatures, thus reducing the possibility of warping, overheating or melting the metals being joined. Brazing is well-suited to the joining of dissimilar metals and produces a strong joint. Brazing provides not only a secure mechanical attachment, but provides the requisite thermal coupling between the fins and core as well. Brazing is also known to be economical and highly adaptable to automated methods. In a particular embodiment, the inner folded portion 230 includes a longitudinal elliptical-shaped opening (shown in FIG. 10), although the invention is not so limited. In this embodiment, the non-swept fin array 220 can be brazed to the core 210 above and/or below the longitudinal opening using a suitable metal, such as a silver alloy. In an alternative embodiment, the fins 219 are soldered to the core 210 using a tin or lead alloy. In other embodiments, there is no longitudinal opening. In another alternative embodiment, the core 210 has non-prismatic-oriented slots into which the inner folded portions 230 can be secured to form a radial array. Securing means into the slot can include press fitting and/or any mechanical and/or adhesive means in conjunction with thermal coupling means, such as thermal grease, epoxy, and so forth. In another alternative embodiment there are no slots and any other means, such as those noted above (e.g., mechanical and thermal grease, etc.) can also be used to couple the non-swept fin array 220 to the core.

Figure 3A:
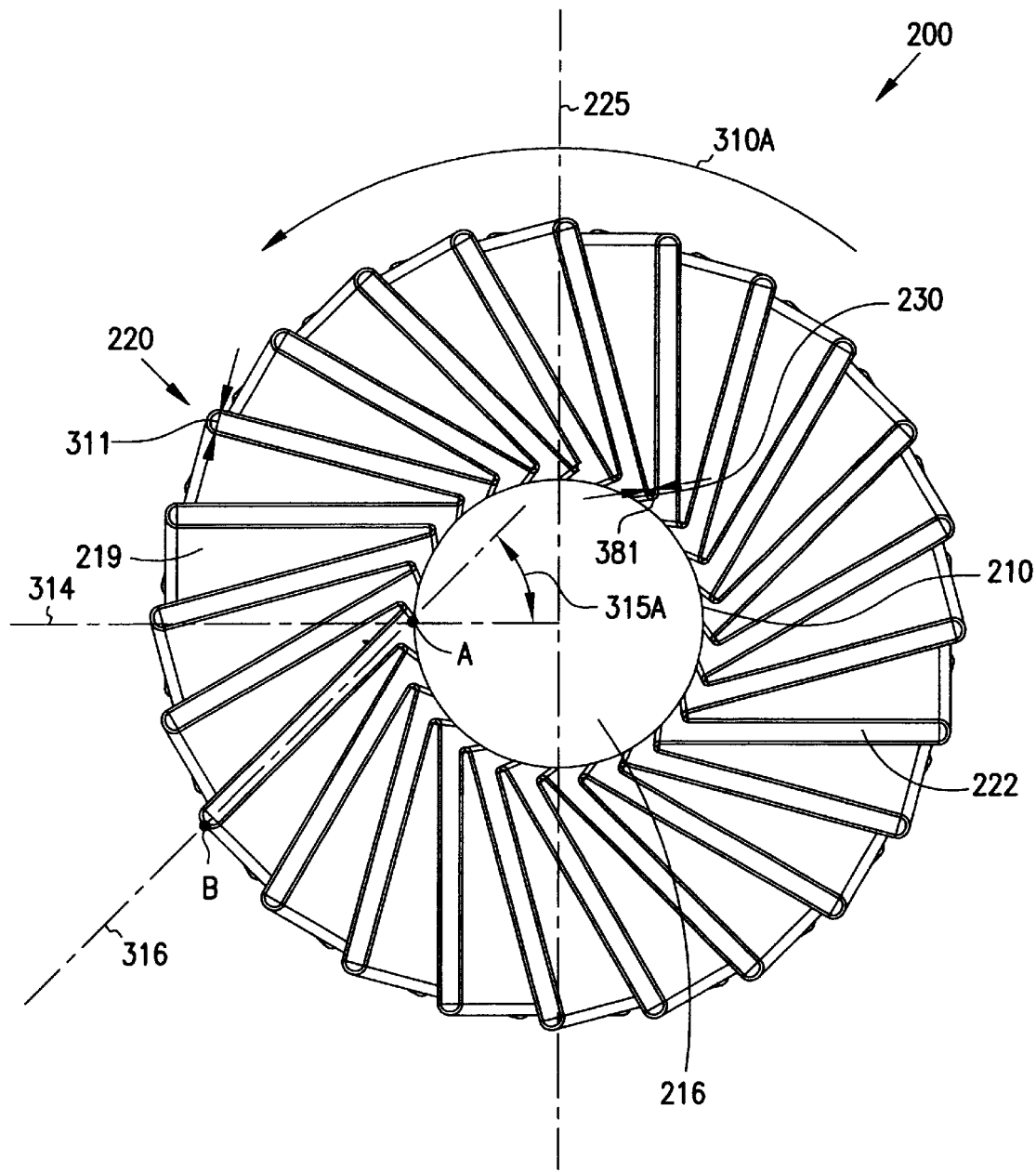
FIG. 3A is a top view of the non-prismatic heat sink shown in FIG. 2 according to the present invention.
Figure 3B:
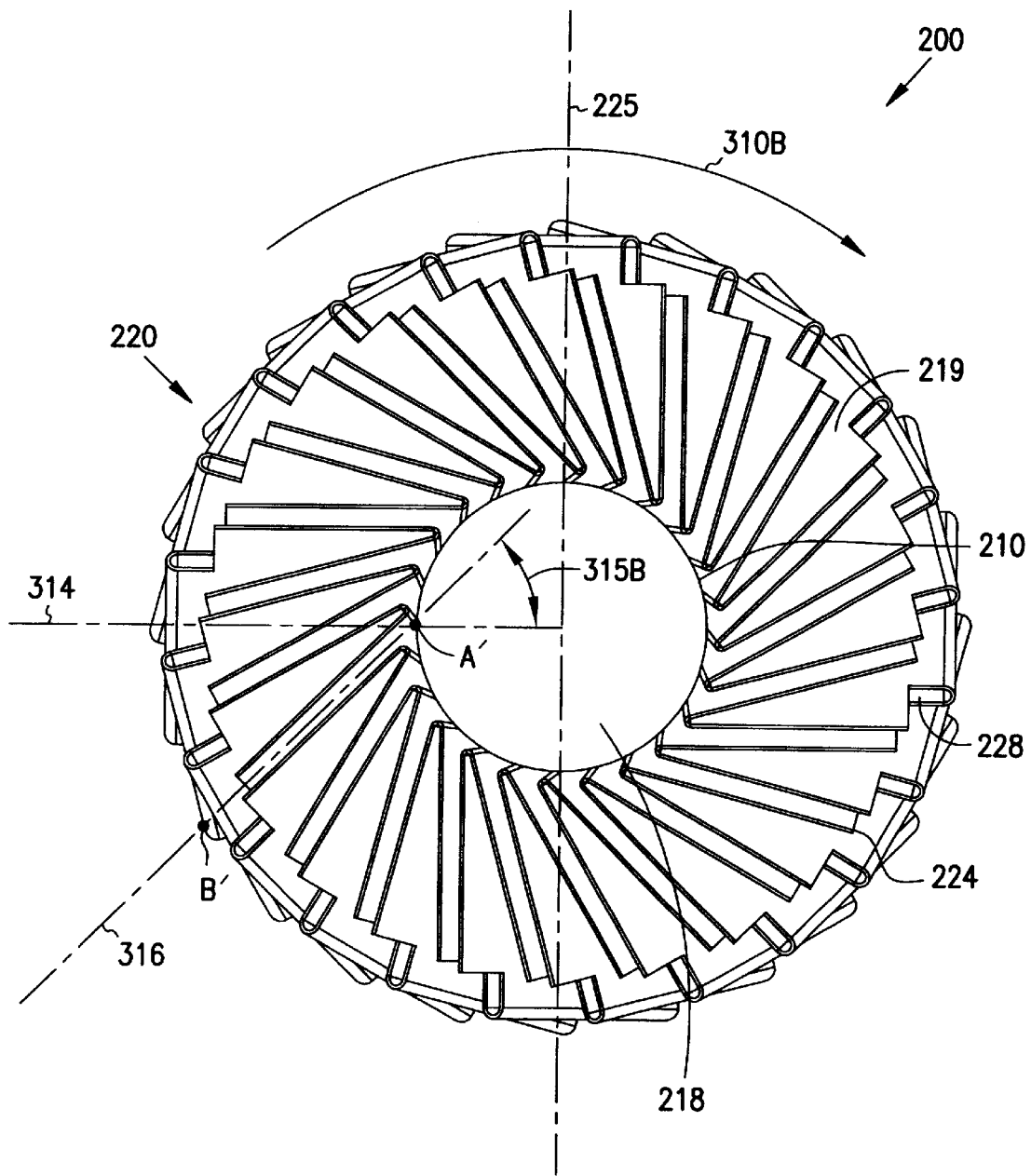
FIG. 3B is a bottom view of the non-prismatic heat sink shown in FIG. 2 according to the present invention.

FIGS. 3A and 3B provide top and bottom views, respectively of the non-swept heat sink 200 shown in FIG. 2. In this embodiment, arrows indicate the direction of rotation from an air movement device, e.g., fan, above (not shown) as viewed from the top (top fan rotation 310A) of the non-swept heat sink 200 and also from the bottom (bottom fan rotation 310B), although the invention is not so limited. Depending on the particular application, the fan may alternately be rotating in the opposite direction, and the fins 219 would also be oriented in the opposite direction, accordingly, to be appropriately aligned with the airflow (See FIG. 4). The radial line 314 can be oriented at any suitable acute angle to the fin center line 316. In the embodiment shown in FIG. 3A, radial line 314 is at an approximately 45 degree angle 315A to the fin centerline 316 where they contact at the core 210. Angle 315A is essentially a "trailing" angle in this instance, since a fan blade rotating in the direction shown (310A) would initially pass over the fin 219 at Point "A" near the core 210. After rotating approximately another 45 degrees, i.e., about 0.8 radians, the fan blade would then pass over the outer edge of the fin 219 at Point "B."

As FIG. 3B shows, the bottom fan rotation 310B appears as the reverse of the top fan rotation 310A, with the radial line 314 at an approximately 45 degree angle to a fin centerline 316 where they contact at the core 210. However, as viewed from the bottom, this 45 degree angle is essentially a "leading" angle 315B because a fan blade rotating in the direction shown would initially pass over the outer edge of the fin 219 at Point "B'." After rotating approximately another 45 degrees, i.e., about 0.8 radians, the fan blade would then pass over the fin 219 at Point "A'" near the core 210, as shown.

As FIGS. 3A and 3B illustrate, each fin 219 in this "non-swept" embodiment begins at the top of the heat sink with a "trailing" angle orientation, gradually converting to a "leading" angle orientation at the bottom, i.e., the orientation change occurs substantially uniformly throughout the length of the heat sink, although the invention is not so limited. In other non-swept embodiments in which the rotation of the overhead fan is reversed, the orientation of the fins would also be reversed, and each fin would instead change from a "leading" angle orientation to a "trailing" angle orientation from top to bottom, respectively.

Figure 10:
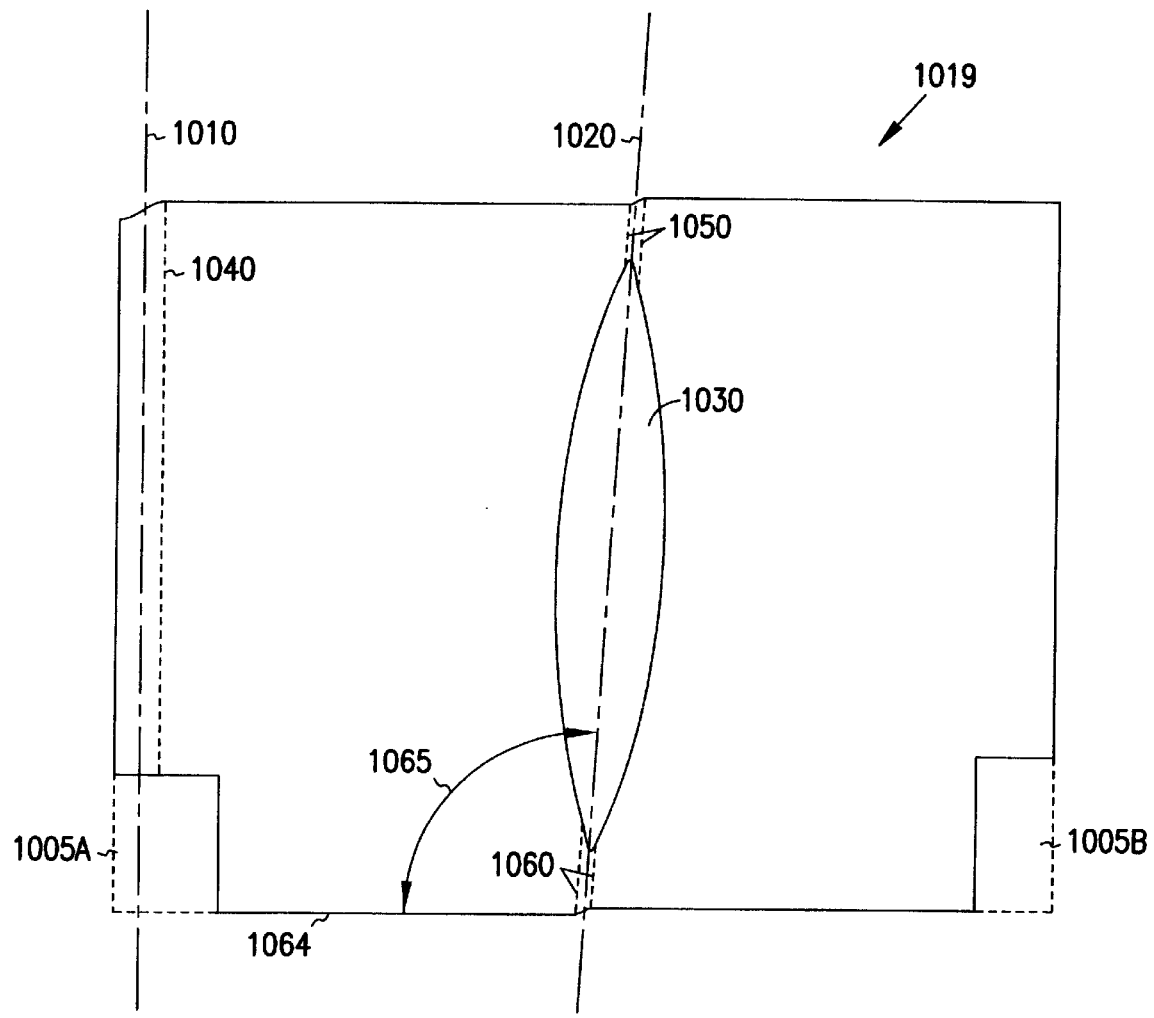
FIG. 10 is a plan view of one embodiment of a single radial fin from FIG. 2 prior to being folded according to the present invention.
Figure 11:
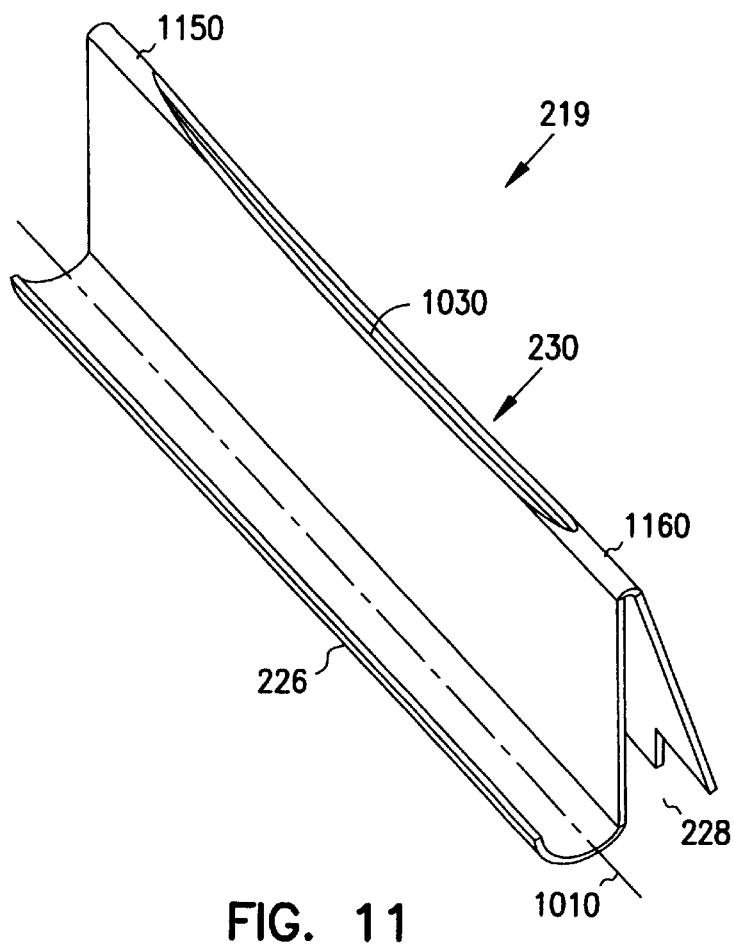
FIG. 11 is an isometric view of the single radial fin of FIG. 10 after a folding operation according to the present invention.
Figure 12:
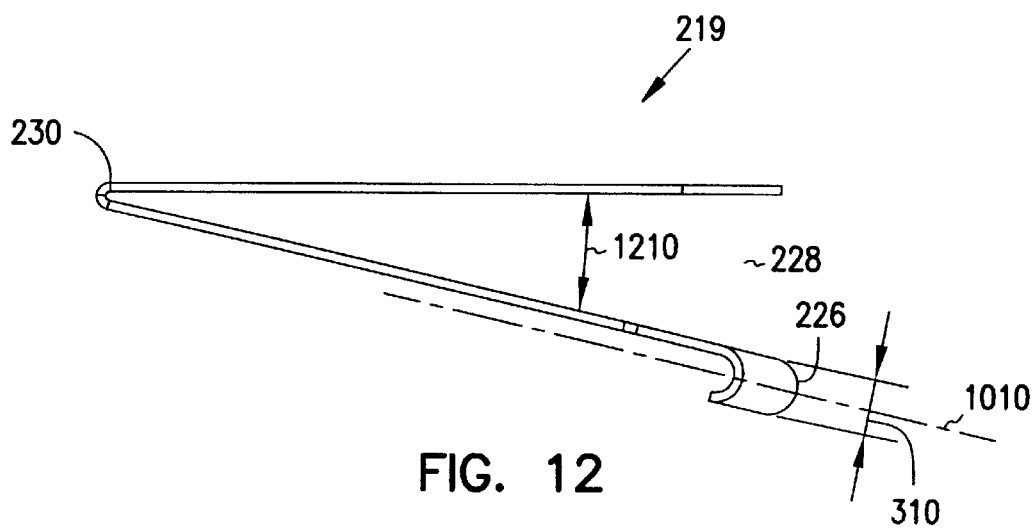
FIG. 12 is a top end view of the single folded radial fin of FIG. 11 according to the present invention.

In this embodiment, as shown in FIG. 3A, the outer "bend radius" 311 of each fin 219, i.e., the dimension of the outer folded portion 226 from top to bottom is substantially the same, i.e., "constant" (See also FIGS. 10–12). The actual dimension of the outer bend radius 311 is dependent on the particular application. In one embodiment, the outer bend radius 311 is between approximately one (1) and three (3) mm. In another embodiment, the outer bend radius 311 is about 1.4 mm. The inner bend radius 381 of the inner folded portion 230 can also be any suitable dimension, although it is generally smaller than the outer bend radius 311 to maximize the number of fins. In one embodiment, the inner folded portion 230 has a constant inner bend radius 381 of about between about 0.1 and 0.3 mm. In another embodiment, the inner bend radius 381 is about 0.2 mm.

Figure 3C:
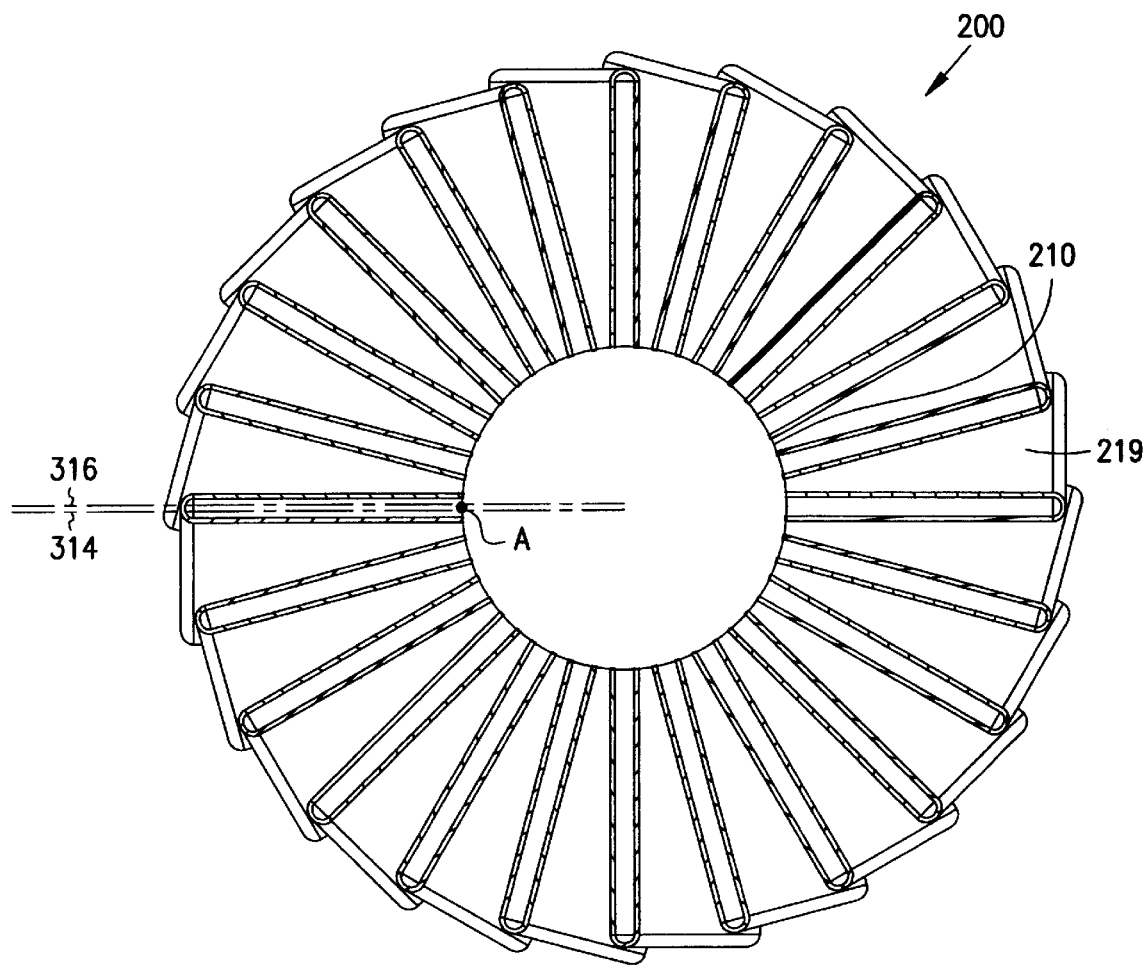
FIG. 3C is a cross section view of the non-prismatic heat sink of FIG. 2 taken along line 3—3 of FIG. 2 according to the present invention.

FIG. 3C provides a cross-sectional view of the "non-swept" heat sink 200 along line 3—3 of FIG. 2, i.e., a slice taken at the center of the heat sink 200, as viewed from the top. As can be seen, the radial line 314 is substantially parallel to the fin centerline 316 where they meet at the core, i.e., Point "A." In one embodiment, the fin centerline 316 is within about two (2) degrees of being parallel with the radial-line 314.

Figure 3D:
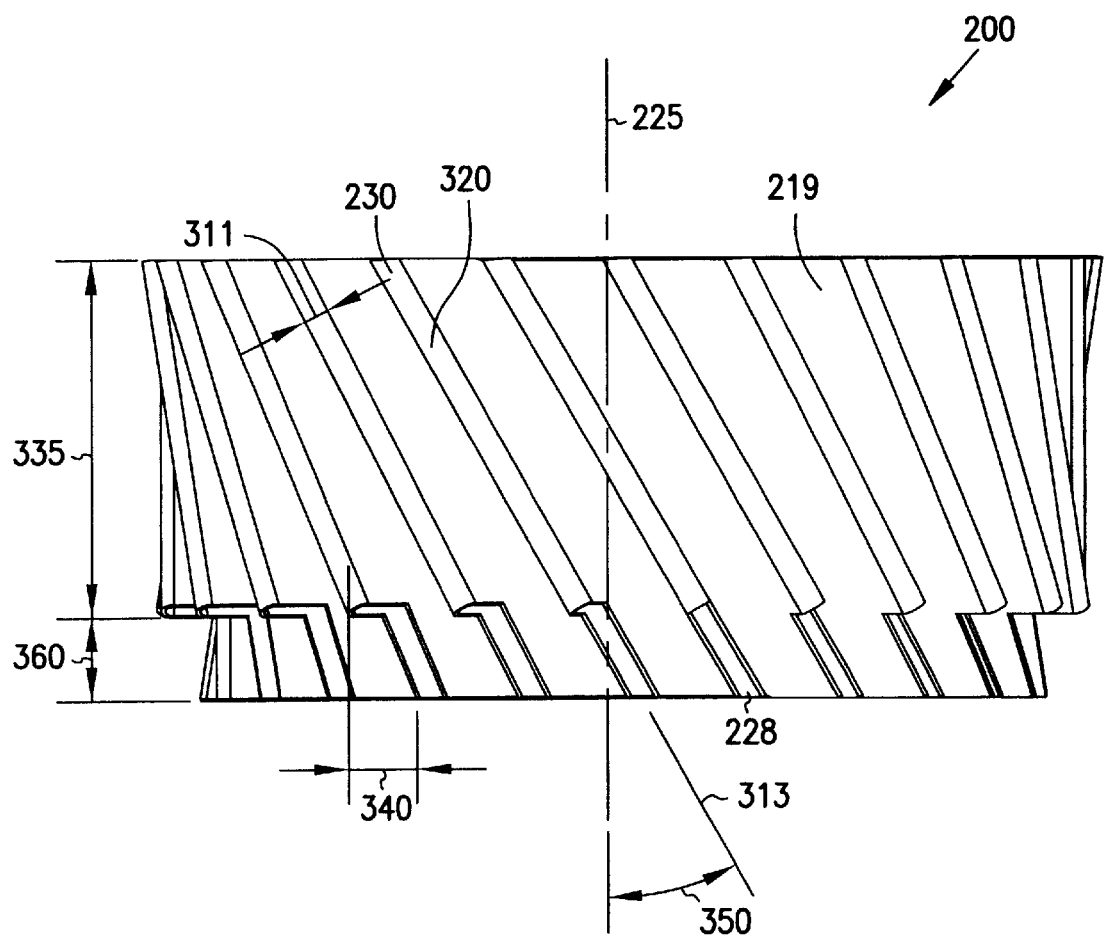
FIG. 3D is a side view of the non-prismatic heat sink shown in FIG. 2 according to the present invention.

FIG. 3D provides a side view of the non-swept heat sink 200. As can be seen, the fins 219 are tilted front to back in relation to the core longitudinal axis 225 such that they form a non-prismatic fin array 220, as defined herein. The fins 219 can be oriented at any suitable tilt or angle from the core longitudinal axis 225. The direction and amount of tilt depends on the overhead fan (See FIG. 4), number of fins, fin size, and so forth. In one embodiment, the tilt angle 350, i.e., the angle between the core longitudinal axis 225 and fin centerline 313 as shown in FIG. 3D is between about 20 and 50 degrees.

Distance 335, which extends from the top to the bottom of the outer folded portion 226 in relation to a notched opening height 360 will also vary, depending on the particular application. In most embodiments, however, the dimension of distance 335 to notched opening height 360 is between about 3:1 and 5:1. In one embodiment, distance 335 is between about 35 and 40 mm and notched opening height is between about seven (7) and 12 mm. In a particular embodiment, distance 335 is about 36 mm and the notched opening height 360 is about nine (9) mm. The notched opening length 340 can also be any suitable dimension, as long as adequate ventilation is provided. In one embodiment, the notched opening length 340 is between about five (5) and ten (10) mm. In a particular embodiment, the notched opening length 340 is about 6.7 mm. Optimization of these and other fin dimensions involves minimizing pressure build-up throughout the fins while maximizing the distance air can be pushed down through the length of the core. The determination of these and other fin structure attributes is unique to each fan and heat sink geometry, as well as to the particular application in which these components are being used.

Figure 4:
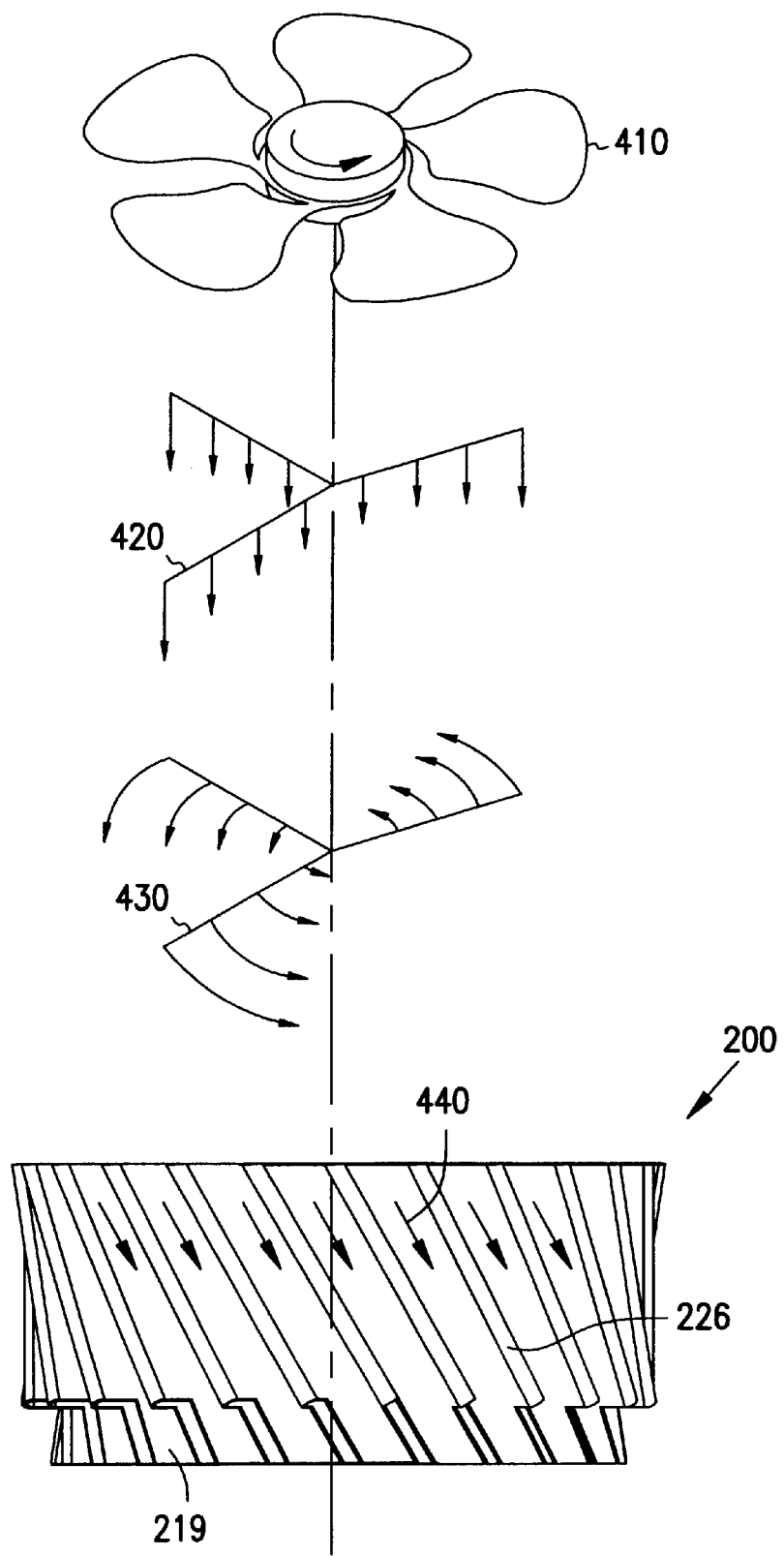
FIG. 4 is a simplified schematic illustration showing airflow from an impinging axial fan into a non-prismatic heat sink according to the present invention.

FIG. 4 illustrates how a non-prismatic heat sink, such as the "non-swept" non-prismatic heat sink 200, intercepts the type of airflow generated by an axial fan 410 as it is rotating counterclockwise. (Although this example utilizes the "non-swept" fin array 220, the principles discussed in reference to FIG. 4 are also applicable to the "swept" fin array 620 described below). As shown in FIG. 4, an axial fan generates two components of blade force on the air. One component is directed axially, i.e., an axial component 420. Depending on the orientation of the fan, the axial component 420 may exist in any given direction. In the embodiments shown herein, it is assumed that the fan is an "impinging" fan such that the axial component 420 is a substantially vertical component oriented in a downwardly direction. It is the axial component 420 that provides pressure rise by a process referred to as "direct blade action." The other component is in the tangential direction, i.e., the tangential component 430. The tangential component 430 provides reaction to the driving torque, setting the air spinning about the axis of the fan 410 independently of its forward motion. Together, the axial component 420 and the tangential component 430 produce a resulting flow vector 440 that is angled in a downwardly direction. Depending on the blade geometry of the fan, the primary component can vary from mostly axial to mostly tangential.

It is also known that the velocity of the airflow from an axial fan is a function of fan radius. Specifically, since a blade moves faster and faster as one moves further from the centerline, the air moves faster further out as well. Additionally, since the outer part of a blade is traveling on a larger circle as compared with the inner portion, its linear velocity is also greater. It is farther known that in most typical fan impellers, surface area is a function of fan radius. Specifically, the size of a blade increases as one moves further away from the center. As a result, axial fans are known to move the most air at the fastest speed at the outermost edges of the fan blades.

The non-prismatic heat sinks of the present invention are designed to catch not only the slower-moving air nearer the fan center, but also the higher speed air, including the large volume of air that is moving at the highest velocity at the outer perimeter of the blade path, and direct most of it towards the core. This provides an advantage over prismatic heat sinks since there is more air staying within the fins throughout the length of the heat sink, resulting in increased cooling of the core (particularly with the swept array described below). Specifically, a "prismatic" fin array would be oriented only toward the axial component 420, leaving the tangential component 430 to impinge on the tops of the fins and remain unused for cooling purposes.

As FIG. 4 shows, the non-swept fin array 220 is oriented or tilted in substantially or nearly the same direction as the resulting flow vector 440. It is important to note, however, that if the non-prismatic fin arrays were aligned "perfectly"

with the resulting flow vector 440, i.e., at about 45 degrees for an axial fan having equal amounts of tangential and axial components, all of the air would blow directly through the fin and not be directed towards the core, where it is most needed. As a result, there is a need to allow at least a small portion of the air to impinge on the fins in order to allow it to be directed towards the core, as is desired. In most embodiments, therefore, the fins are oriented such that at a small percentage of the resulting flow vector impinges on the fins. In one embodiment, the resulting airflow vector 440 is entering the fins at about a 45 degree angle from vertical and the fins are oriented between about 15 and 35 degrees in the same direction. In another embodiment (when the vector 440 is about 45 degrees), the fins are oriented between about 20 and 25 degrees to the core longitudinal axis 225.

In other words, the non-prismatic fin array 220 is tilted into the direction of fan rotation at an angle that is less than perpendicular to the air flow, such that when air strikes a fin 219, its momentum carries it forward along the path of least resistance toward the core 210. As a result of this improved alignment of the flow vector 440, there is a reduced pressure drop within each fin from top to bottom, and an increased mass flow through the heat sink device. There is also a lower apparent impedance for the heat sink such that the air tends to penetrate deeper into the heat sink prior to turning and exiting. (This orientation also has the added benefit of reducing the impedance on the fan, such that for a given volume the fan will run slower because it is blowing more air into the heat sink as compared with a heat sink having vertically-oriented or prismatic fins). In one embodiment, the pressure drop throughout each non-prismatic folded fin from top to bottom is reduced, the impedance is reduced and the mass flow through the heat sink device is higher, depending upon the mating configuration of the fan and heat sink. In one embodiment, the mass flow is increased by about 50% as compared with prismatic fin arrays.

Furthermore, the overall speed and amount of airflow through each non-prismatic fin is increased, as compared with a prismatic fin, in direct proportion to the amount of tangential airflow present. For example, if the tangential component comprises about 50% of the total airflow, the radial orientation of the fins causes an apparent increase in speed and amount of airflow through the fin array of about 50%, as compared with a substantially perpendicular fin. In other embodiments, the percentage increase may vary, depending on the angle of the fins. Additionally, as compared with devices in which the fan is recessed inside the fin array, the combination of the non-prismatic heat sinks of the present invention with an overhead fan allow for a wider range of tilt angles for the fins. (See, for example, U.S. Pat. No. 5,785,116 to Wagner, issued Jul. 28, 1998 and U.S. Pat. No. 5,975,194 to Wagner, issued Nov. 2, 1999).

Figure 5:
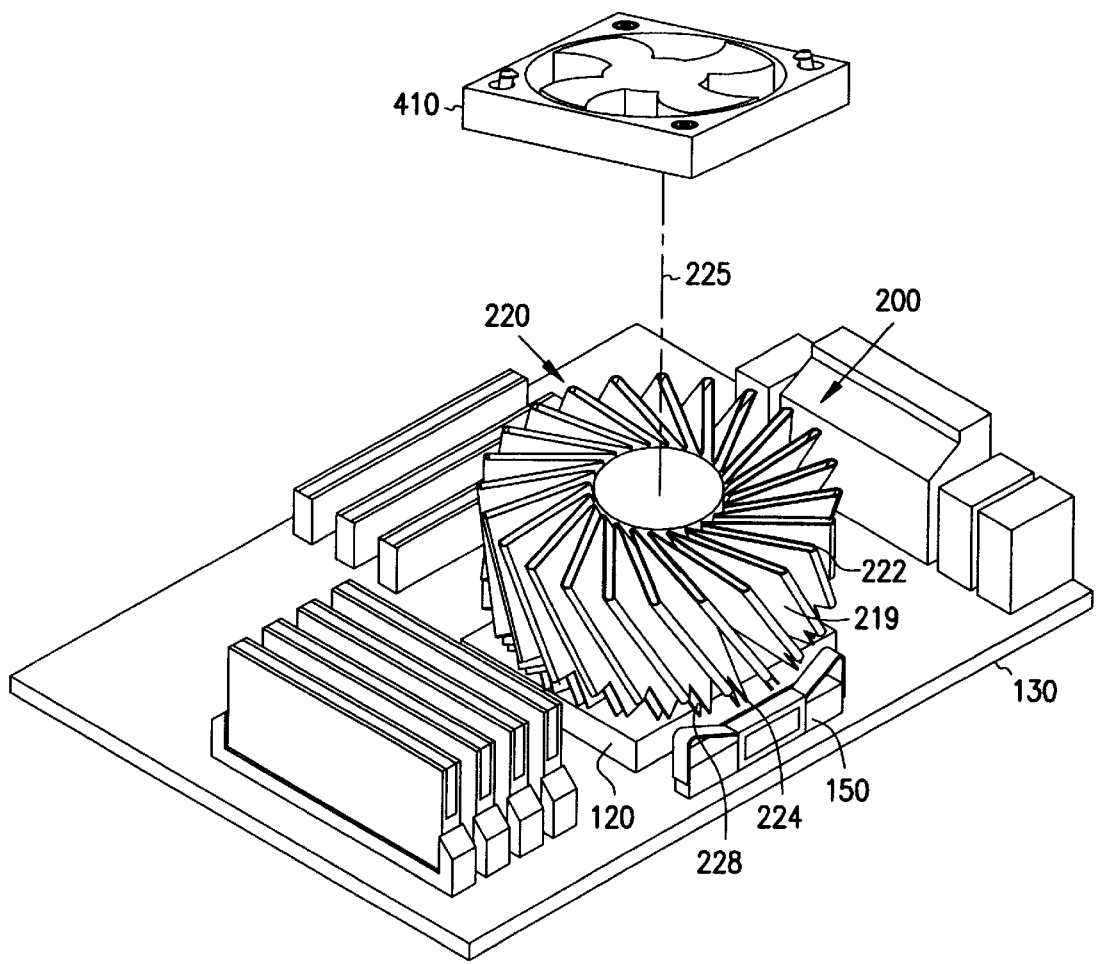
FIG. 5 is an isometric view showing the non-prismatic heat sink of FIG. 2 attached to a microprocessor on an assembled system board according to the present invention.

FIG. 5 shows an assembled system board 130 containing an electronic assembly that includes a microprocessor 120, impinging axial fan 410 and the non-swept heat sink 200. The interface between the microprocessor 120 and the non-swept heat sink 200 can further include other components as is known in the art, including, but not limited to thermal interfaces (e.g., thermal grease, phase change materials, and so forth), an integrated heat spreader, mechanical plastic components and so forth. In some embodiments the center line of the microprocessor 120 is offset with the centerline of the heat sink. Although the impinging axial fan 410 is shown, the invention is not so limited. In an alternative embodiment, the impinging axial fan 410 can be replaced with a centrifugal fan or blower.

As noted above, the notched opening 228 in each fin 219 prevents undesirable pressure build-up. However, such a design further has approximately the same benefits associated with a fin array 260 comprised of fins having lower portions 224 with small footprints, as noted in U.S. application Ser. No. 09/766,757, supra. Specifically, this type of design, in which the lower portion 224 of each fin 219 in the fin array 220 has a smaller footprint than the upper portion 222, utilizes system board space efficiently. In this way, other components can encroach around and in close proximity to the lower portions 224 of the fins 219 in the fin array 220 when the non-swept heat sink 200 is mounted onto a microprocessor 120. In some embodiments, the components can encroach onto the microprocessor 120 without mechanically interfering with the omni-directional flow around the core 210.

Figure 6:
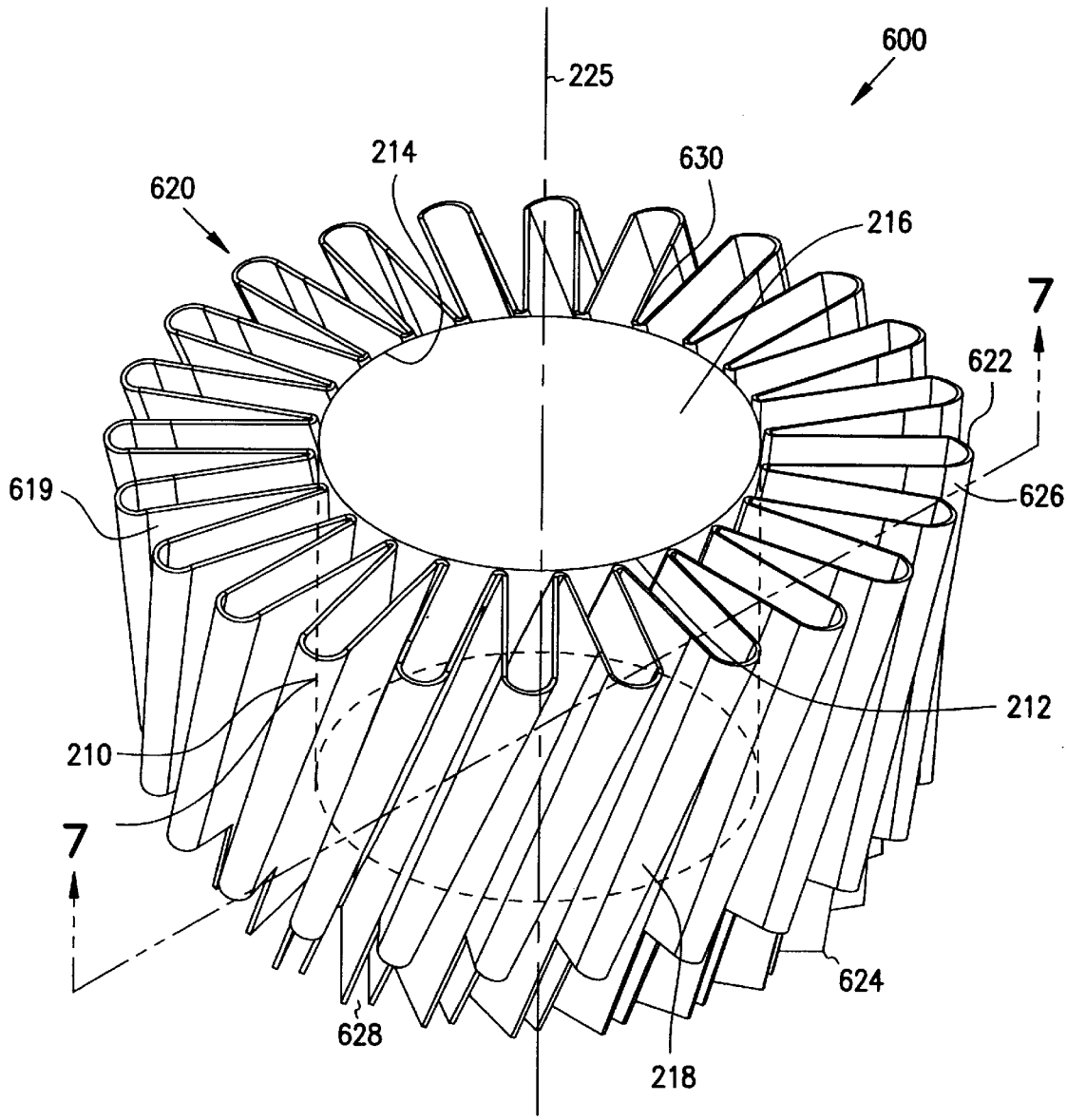
FIG. 6 is an isometric view of a second embodiment of a non-prismatic heat sink according to the present invention.

FIG. 6 illustrates another embodiment of a non-prismatic heat sink according to the present invention. In this embodiment, however, the heat sink is a "swept" non-prismatic radial folded fin heat sink (hereinafter "swept heat sink"). The swept heat sink 600 comprises the thermally conductive core 210 described herein and a plurality of non-prismatic, swept folded fins 619 arranged in a corrugated or "accordion" style to form a swept fin array 620. Each individual fin 619 is contiguous with the adjacent fin 619 and further has an upper portion 622 and a lower portion 624. Each fin 619 further has a folded outer portion 626 that extends from the upper portion 622 to a notched opening or vent 628 located in the lower portion 624 as shown. Each individual fin 619 further has a folded inner portion 630 secured to the core 210.

The swept fin array 620 has a number of features in common with the non-swept fin array 220 described herein, including, but not limited to, the properties and features of the core 210, materials used for the fins and core, orientation of the folded inner portions to the core, means of securing the fin array to the core 210, and so forth. However, with the swept fin geometry, the fins 619 are designed and oriented in a different manner, as shown and described in FIGS. 13–16, which results in the ability to channel even more air towards the core 210 as compared with the non-swept fin geometry.

Figure 7A:
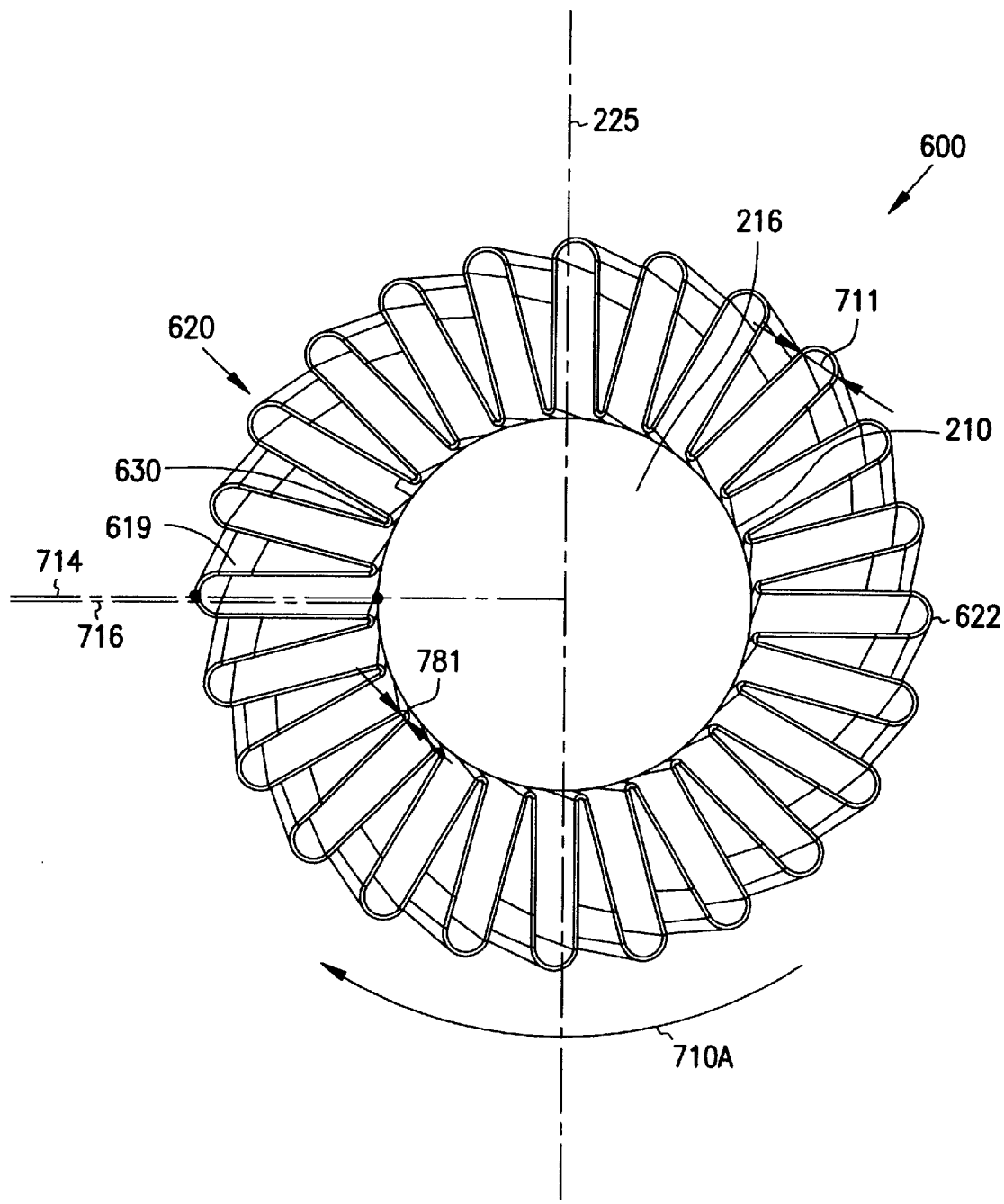
FIG. 7A is a top view of the non-prismatic heat sink shown in FIG. 6 according to the present invention.
Figure 7B:
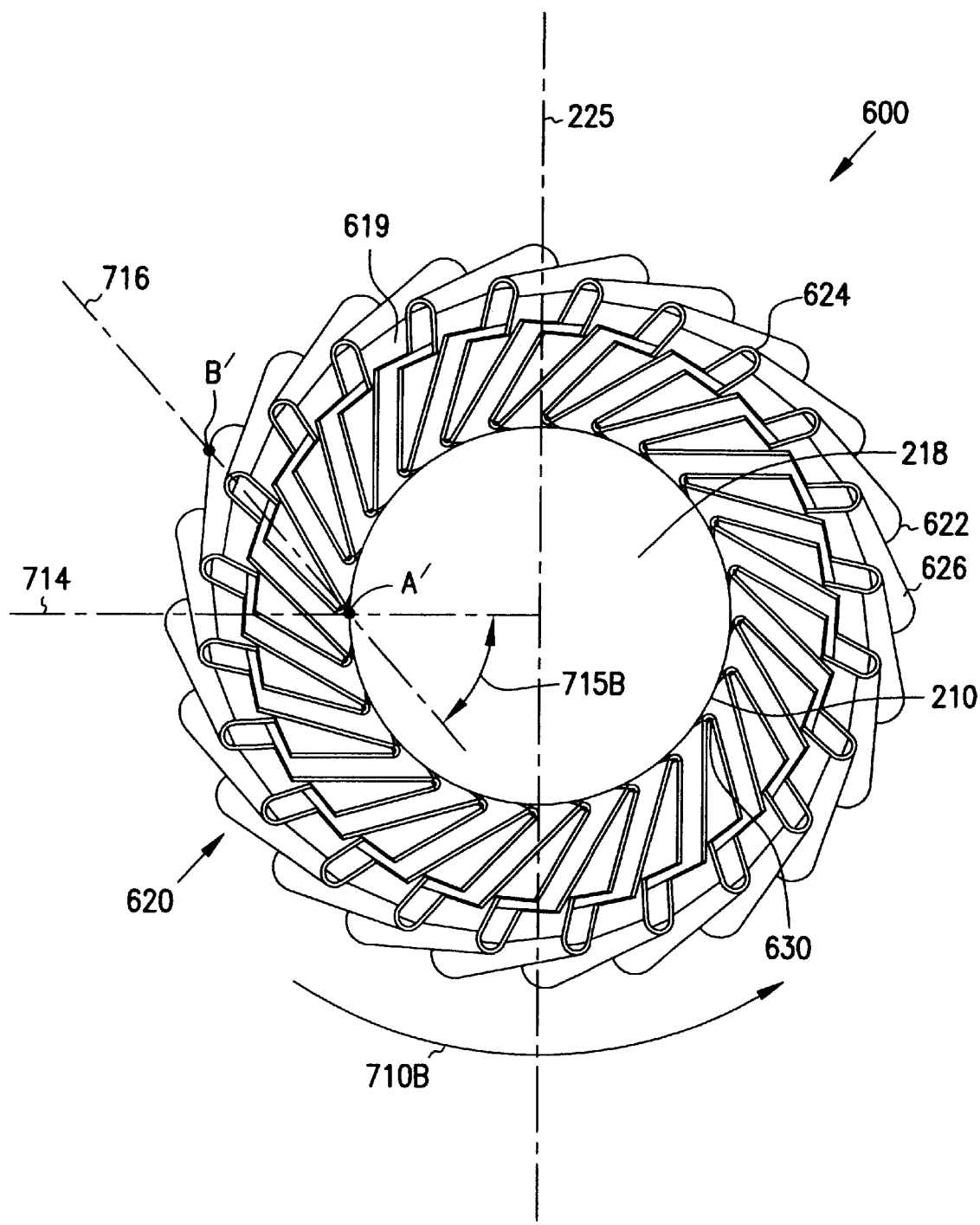
FIG. 7B is a bottom view of the non-prismatic heat sink shown in FIG. 6 according to the present invention.

FIGS. 7A and 7B provide top and bottom views, respectively, of the "swept" heat sink 600 shown in FIG. 6. In this embodiment, arrows indicate the direction of rotation from an air movement device above (not shown) as viewed from the top (top fan rotation 710A) of the swept heat sink 600 and also from the bottom (bottom fan rotation 710B), although the invention is not so limited. Depending on the particular application, the device may alternately be rotating in the opposite direction, and the fins 619 would also be oriented in the opposite direction, accordingly, to be appropriately aligned with the airflow (See FIG. 4). In this embodiment, radial line 714 is substantially parallel to a fin centerline 716 where they contact at the core 210. Furthermore, as shown in FIG. 7A, the fins 619 are substantially perpendicular to the core 210 at the top, rather than at the center of the heat sink as in the "non-swept" embodiment. Furthermore, unlike the "non-swept" embodiment, there are no "trailing" or "leading" angles to the fin array 620 when viewed from the top. Specifically, a fan blade rotating in the direction shown (710A) would initially pass over the fin 619 at Points "A" and "B" at about the same time.

As FIG. 7B shows, the bottom fan rotation 710B appears as the reverse of the top fan rotation 710A, with the radial line 714 at an approximately 20 to 30 degree angle to a fin centerline 716 where they contact at the core 210. As viewed from the bottom, this angle is essentially a "leading" angle 615B such that a fan blade rotating in the direction shown would initially pass over the outer edge of the fin 619 at point "B'." After rotating only about 20 to 30 degrees, the fan blade would then pass over the fin 619 at point "A'" near the core 210, as shown. With a "leading" angle or edge of this magnitude, most of the airflow is forced towards the core 210, which is highly desirable, as the core is the hottest portion of a heat sink. In other swept embodiments in which the rotation of the fan is reversed, the orientation of the fins would also be the reversed, and each fin would instead change from a "leading" orientation to essentially a substantially parallel orientation from top to bottom, respectively. Generally, however, as compared with the non-swept embodiments described herein, swept embodiments can force more air towards the core.

Figure 7C:
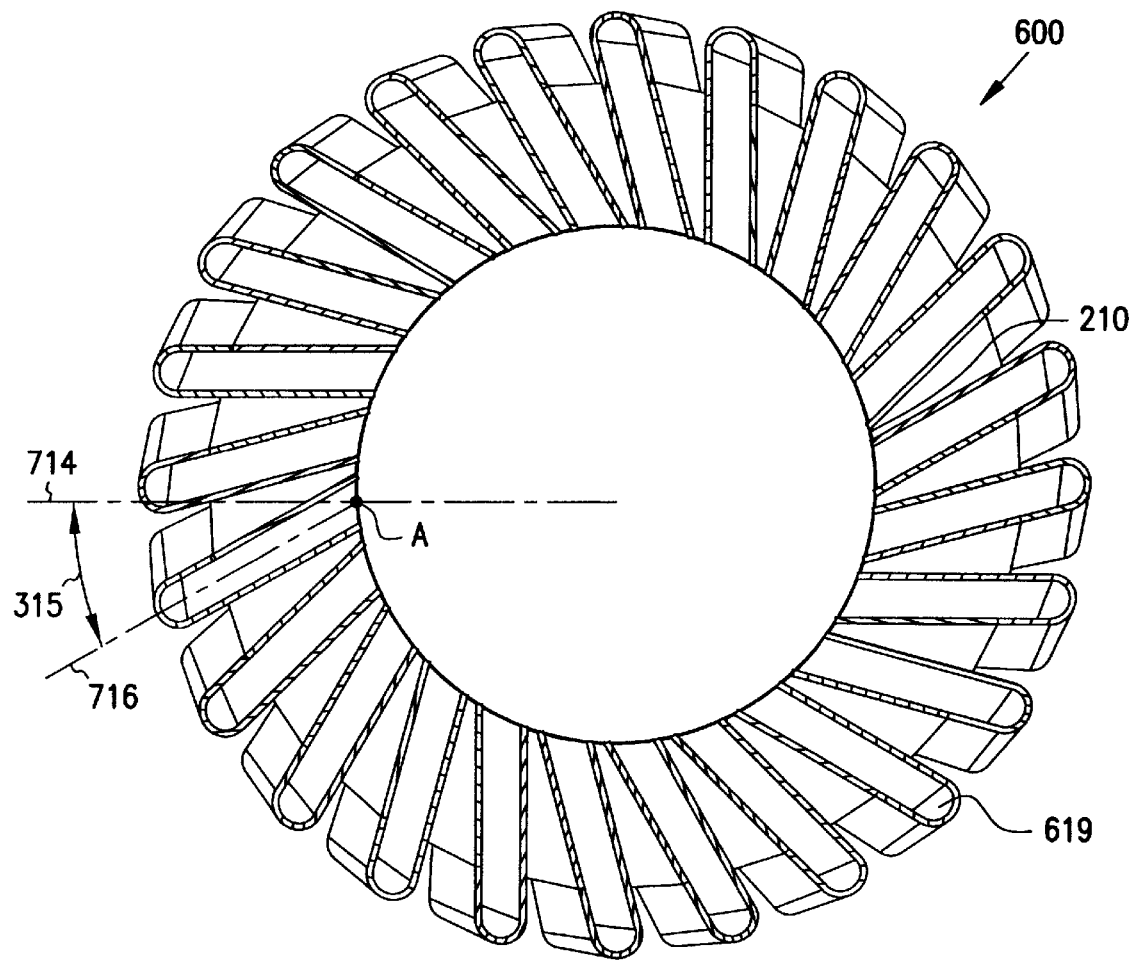
FIG. 7C is a cross section view of the non-prismatic heat sink of FIG. 6 taken along line 7—7 of FIG. 6 according to the present invention.
Figure 7D:
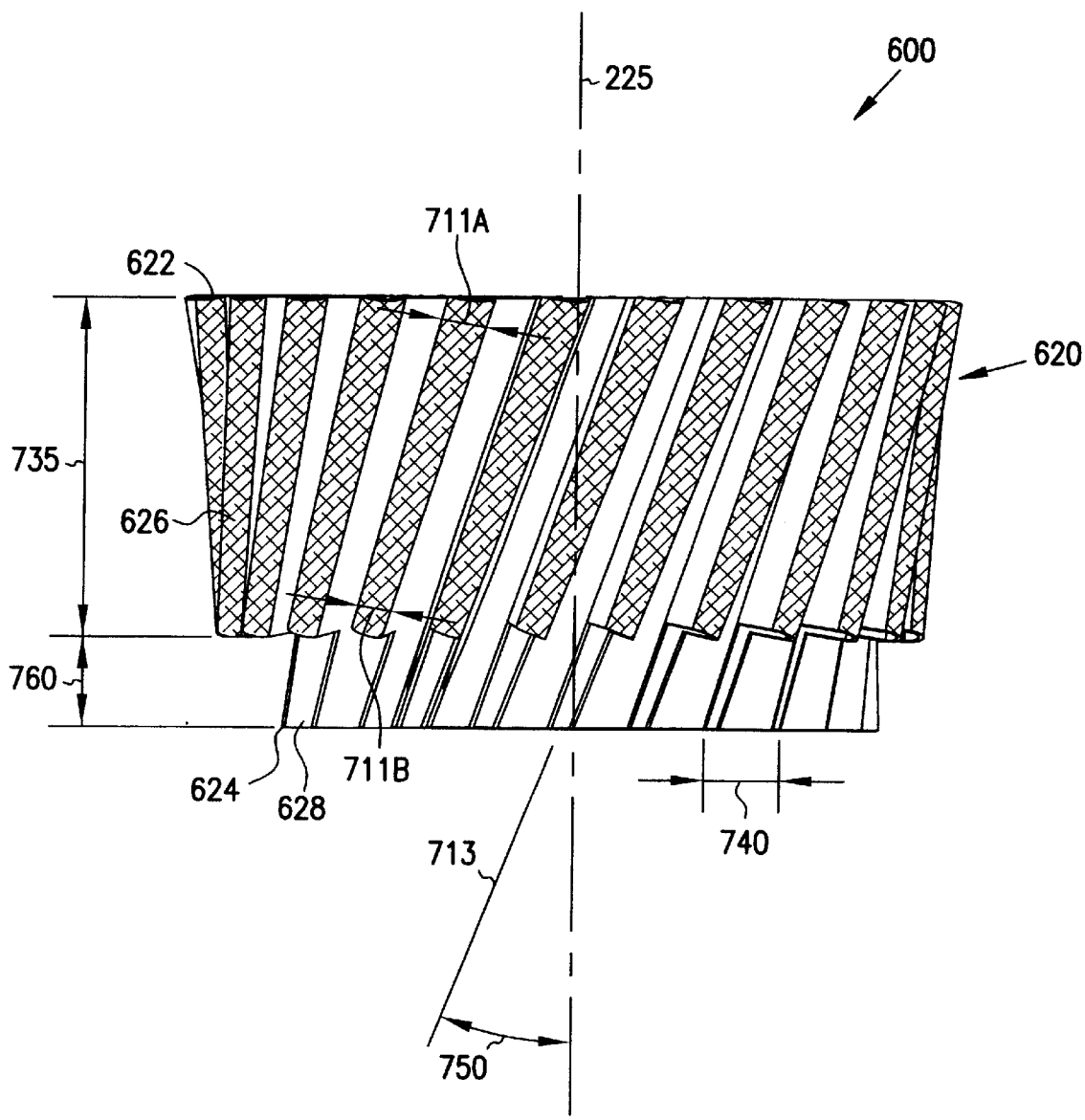
FIG. 7D is a side view of the non-prismatic heat sink shown in FIG. 6 according to the present invention.

The "outer bend radius" 711 (shown in FIG. 7A) of each fin 619, i.e., the dimension of the outer folded portion 626 from top to bottom is variable from top to bottom (See FIG. 7D). The inner bend radius 781 of the inner folded portion 630, however, is substantially constant from top to bottom, and can also be any suitable dimension. Generally, the inner bend radius 781 is smaller than the minimum outer bend radius (711B shown in FIG. 7D), located at the "bottom" of each fin 619. In one embodiment, the inner folded portion 630 has an inner bend radius 781 of about 0.2 to 1.2 mm. In another embodiment, the inner bend radius 781 is about 0.6 mm.

FIG. 7C provides a cross-sectional view of the "swept" heat sink along line 7—7 of FIG. 6. As can be seen, the radial line 314 is at an angle of about 20–30 degrees with the fin centerline 716 where they meet at the core, i.e., Point "A"

FIG. 7D provides a side view of the swept heat sink 600. As can be seen, the fins 619 are tilted front to back in relation to the core longitudinal axis 225 such that they form a non-prismatic fin array 620, as defined herein. The fins 619 can be oriented at any suitable tilt or angle from the core longitudinal axis 225, with the maximum angle reached at the top when the lower portion of the fin 619 becomes tangent to the core 210. Other factors affecting the direction and amount of tilt include those discussed herein for the non-swept embodiment. In one embodiment, the tilt angle 750, i.e., the angle between the core longitudinal axis 225 and the fin centerline 713 is between about 15 and 25 degrees.

As shown in FIG. 7D, the outer bend radius (711 in FIG. 7A) varies from a maximum outer bend radius 711A at the top to a minimum outer bend radius 711B at the bottom of each fin 619 in this embodiment. During use, this configuration serves to force the air to distribute more evenly as compared with the non-swept embodiment, essentially funneling even more air towards the core 210. In one embodiment, the maximum outer bend radius 711A is about one (1) to three (3) mm, tapering down to a minimum outer bend radius 711B (at the bottom of each fin 619) of about 0.5 to 1.5 mm. In another embodiment the maximum outer bend radius 711A is about 1.7 mm, tapering down to the minimum outer bend radius 711B of about one (1) mm.

Distance 735, which extends from the top to the bottom of the outer folded portion 626, will also vary in relation to a notched opening height 760, depending on the particular application. In most embodiments, however, the dimension of distance 735 to notched opening height 760 is between about 3:1 and 5:1. In a particular embodiment, distance 735 is between about 25 and 35 mm. In a particular embodiment, distance 735 is about 30 mm. The notched opening length 740 can also be any suitable dimension, as long as adequate ventilation is provided. In one embodiment, the notched opening length 740 is between about seven (7) and 11 mm.

In a particular embodiment, the notched opening length 740 is about nine (9) mm. Optimization of these and other fin attributes can be determined as noted above.

Figure 8:
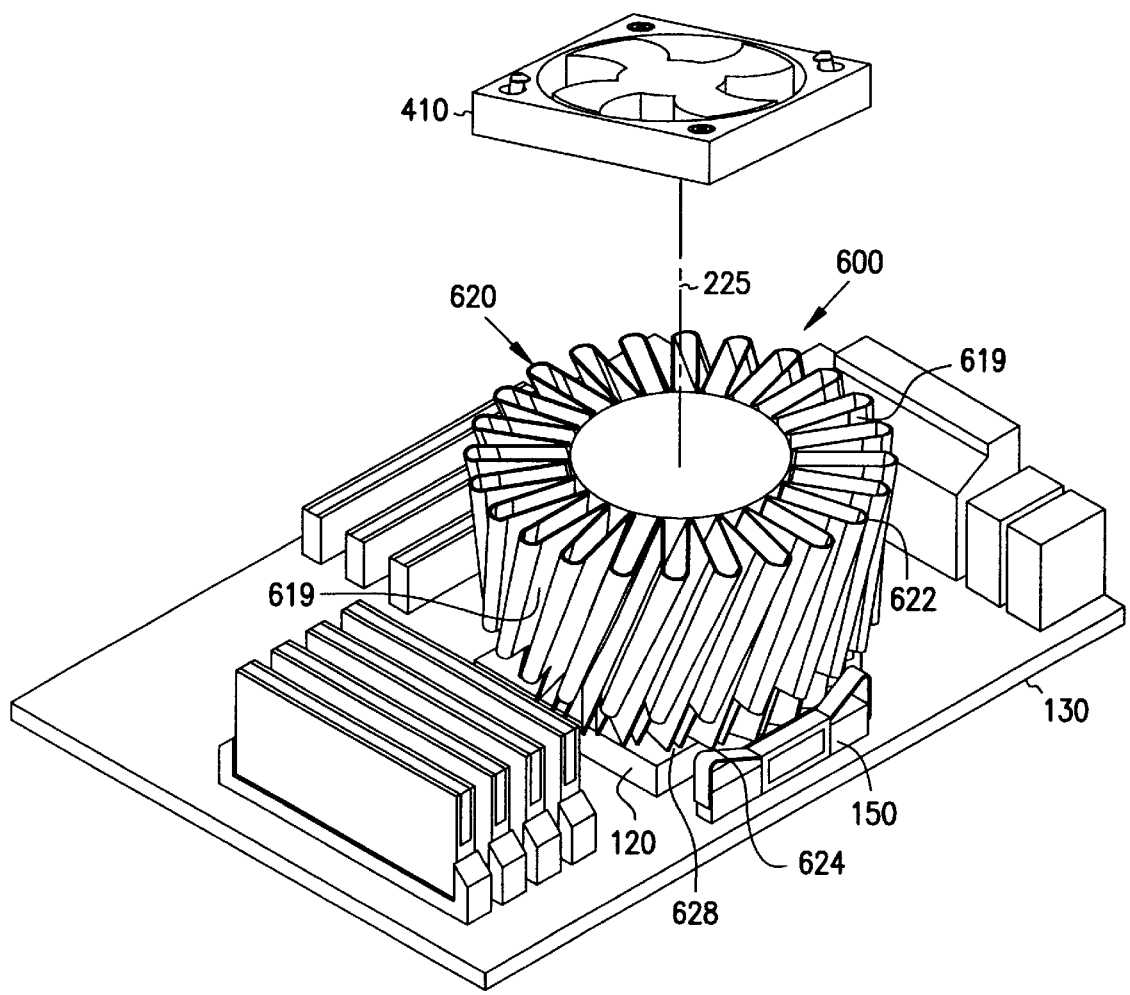
FIG. 8 is an isometric view showing the non-prismatic heat sink of FIG. 6 attached to a microprocessor on an assembled system board according to the present invention.

FIG. 8 shows an assembled system board 130 containing an electronic assembly that includes a microprocessor 120, impinging axial fan 410 and the non-swept heat sink 600. The interface between the microprocessor 120 and the swept heat sink 200 can further include other components as is known in the art, including, but not limited to thermal interfaces (e.g., thermal grease, phase change materials, and so forth), an integrated heat spreader, mechanical plastic components and so forth. In some embodiments the center line of the microprocessor 120 is offset with the centerline of the heat sink. Although the impinging axial fan 410 is shown, the invention is not so limited. In an alternative embodiment, the impinging axial fan 410 can be replaced with a centrifugal fan or blower.

In operation, electronic assemblies having the non-prismatic radial folded fin heat sinks of the present invention provide enhanced heat dissipation to other portions of electronic assemblies as compared with conventional heat dissipation devices. By orienting the radial folded fins as described herein, the heat sinks of the present invention draw a sufficient amount of heat away from other areas of the electronic assembly, such as microprocessors, and so forth, to allow these components to remain functional. In this way, it is now possible to cool very high-powered electronic systems, including systems requiring 30 to 50 watts or more of power to be drawn off near a temperature of about 100° C. Specifically, a fan rotating in a particular direction will cause air movement as discussed herein. In most embodiments, this air moves in a generally downwardly direction and is captured with the non-prismatic radially-oriented fins of the present invention. The captured air is directed towards a central core, exiting out lower notched openings provided in each fin, as described above.

Figure 9:
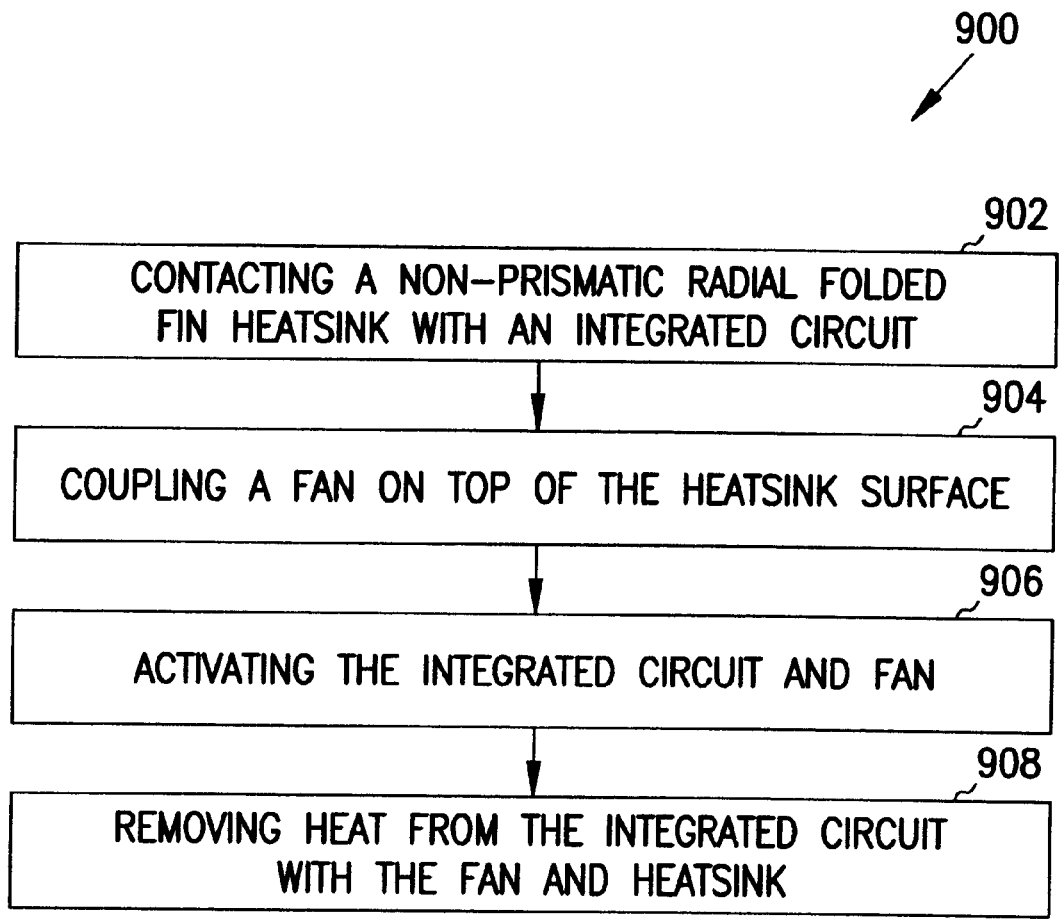
FIG. 9 is a block diagram of one exemplary method for drawing heat away from an electronic component according to the present invention.

As shown in FIG. 9, one embodiment of the method begins by contacting 902 a non-prismatic folded radial heat sink with an integrated circuit, the integrated circuit located on an assembled system board. The method continues by coupling 904 a fan to a top surface of the heat sink, activating 906 a power supply connected to the system board wherein heat is generated by the integrated circuit, and removing 908 heat from the integrated circuit with the fan and radial heat sink.

Methods of Manufacturing Non-Prismatic Radial Folded Fins and Heat Sinks

The fins of both embodiments of the non-prismatic heat sinks 200 and 600 described herein can be made according to any suitable folding process. In one embodiment, a piece of sheet metal, such as copper or aluminum, is placed on a flat surface or form and the desired shape is stamped out repeatedly for each individual fin using stamping means known in the art. FIGS. 10–16 provide views of single fins for illustration purposes only. In most embodiments, the fins are integrally formed as a series of fins.

FIG. 10 provides a plan view of one embodiment of an unfolded fin 1019 used in the non-swept heat sink 200 shown in FIG. 2. The unfolded fin 1019 has been precut from a piece of sheet metal to remove two sections 1005 as shown, which become the notched opening 228 upon folding (See FIG. 11). The unfolded fin 1019 includes an elliptical opening 1030, which helps to properly arrange a series of folded fins around a central cylindrical core, although the invention is not so limited. In one embodiment, the central core has a geometry other than cylindrical and/or the opening has a shape other than elliptical. In an alternative embodiment, there is no opening. Generally speaking, however, the size and geometry of the central core is guided by the size and geometry of components on the circuit board that, together, comprise a "keep-out zone" such that the core design is "matched" with the design of the keep-out zone. Furthermore, alternative core geometry would require substantial modification to the fin design in most instances. In certain embodiments, multiple fin patterns may need to be included in a single fin array.

The elliptical opening 1030 has a centerline 1020 which forms an angle 1065 slightly greater than 90 degrees with the lower edge 1063 of the fin. By orienting the elliptical opening 1030 in this manner, the resulting series of fins is more easily shaped into a fin array around the cylindrical core. Again, in other embodiments, this angle 1065 may be more or less, as required by a particular application. In one embodiment, the angle 1065 is about 80 to 100 degrees. In the embodiment shown in FIG. 10, the angle 1065 is about 94 degrees. Extending above and below the elliptical opening 1030 are upper and lower fold lines, 1050 and 1060, respectively, used to form the inner folded portion 230 shown in FIG. 11. The elliptical opening 1030 can have any length and width in relation to the fin length and width. In the embodiment shown in FIG. 10, the elliptical opening 1030 comprises about 80% of the fin length and about 10% of the maximum fin width. In this embodiment, the upper and lower fold lines, 1050 and 1060, respectively, each comprise about 10% of the fin length. In other embodiments, the elliptical opening 1030 may be longer or shorter as required, as well as narrower or wider. FIG. 10 also shows an outer fold line 1040, which has an outer fold centerline 1010 as shown. The outer fold line 1040 is used to form the outer folded portion 226.

FIG. 11 provides an isometric view of the folded fin 219 after two folding operations have been performed to create the inner folded portion 230 and outer folded portion 226. The inner folded portion 230 is formed when the unfolded fin 1019 is folded around the elliptical centerline 1020 on the upper and lower fold lines, 1050 and 1060, respectively. The outer folded portion 226 is formed around the outer folded centerline 1010 on the outer fold line 1040. In this embodiment, the outer folded portion 226 has a constant bend radius 310.

FIG. 12 provides a side top view of the folded fin 219. In this view the constant outer bend radius 310 can clearly be seen in the outer folded portion 226 having centerline 1010. Additionally the inner angle 1210 between the outer fold 226 and inner fold 230 can be seen. This inner angle 1210 can be any suitable size as required by the particular application. In one embodiment the inner angle 1210 is between about ten (10) and fifteen degrees. In a particular embodiment the inner angle 1210 is about 14.4 degrees.

Figure 13:
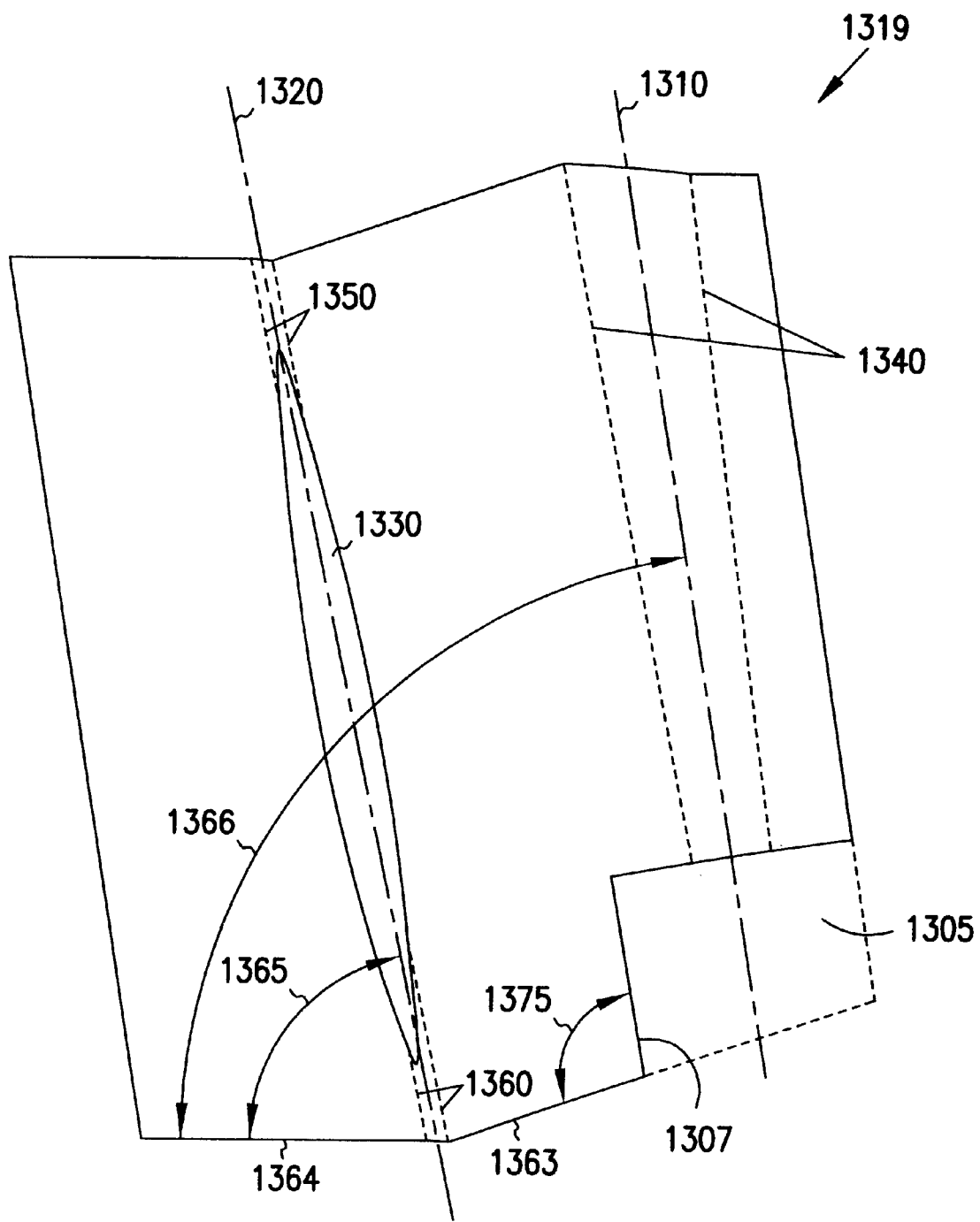
FIG. 13 is a plan view of one embodiment of a single radial fin from FIG. 6 prior to being folded according to the present invention.

FIG. 13 provides a plan view of one embodiment of an unfolded fin 1319 used in the non-swept heat sink 600 shown in FIG. 6. In this embodiment, the unfolded fin 1319 has an irregular shape due to the use of a variable outer bend radius described herein. If the unfolded fin 1319 had a more "regular" configuration, such as the configuration of the unfolded fin 1019 shown in FIG. 10, the series of folded fins formed with a variable outer bend radius would tend to curve inwardly during the manufacturing process, making it difficult to form this type of array on a flat surface. By using an irregular configuration, such as the one shown in FIG. 13, it is now possible to make a folded fin having a variable outer bend radius for use in a non-prismatic array using a single flat piece of sheet metal. Any suitable outer geometry can be used, depending on the fin size, variation in outer bend radius desired, and so forth.

Figure 14:
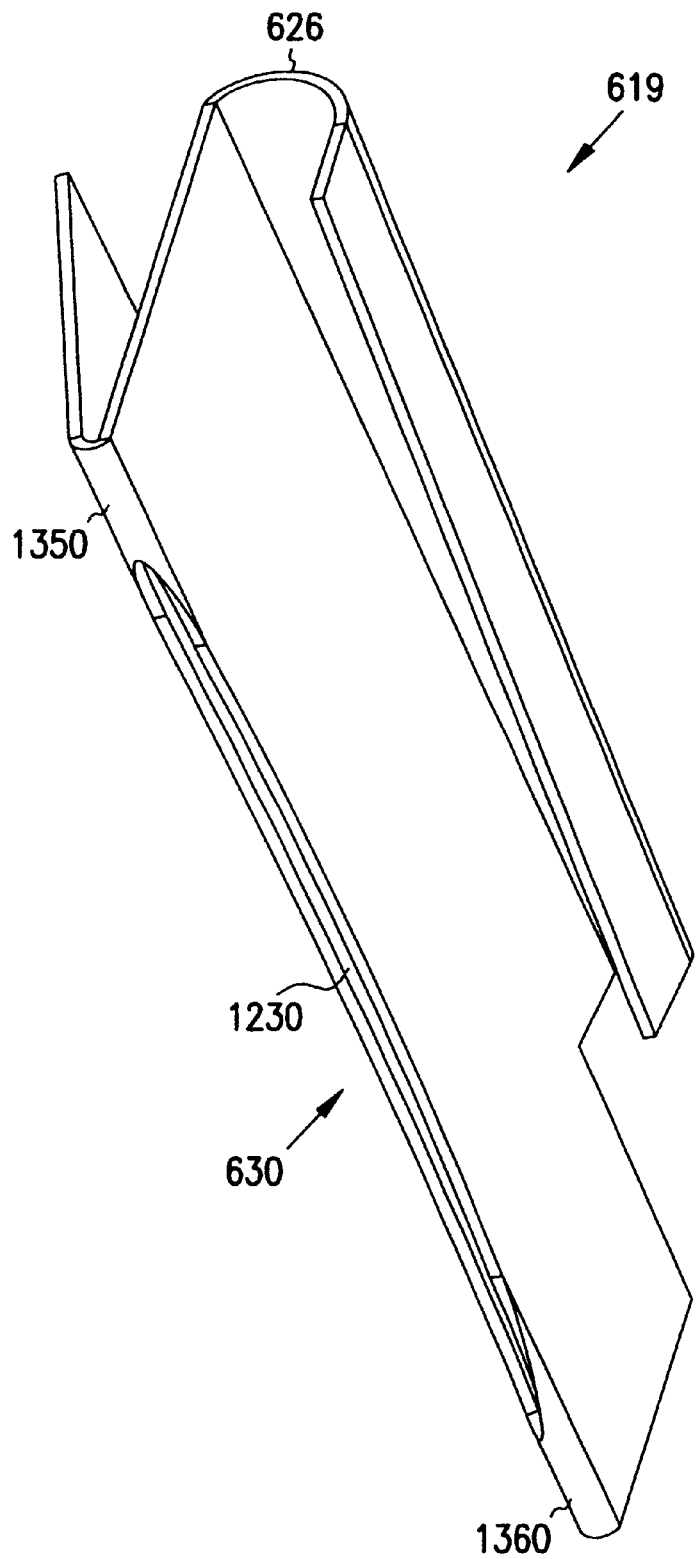
FIG. 14 is an isometric view of the single radial fin of FIG. 13 after a folding operation according to the present invention.

In this embodiment, the outer geometry of the unfolded fin 1319 further includes removal of a single rectangular section 1305 as shown, which becomes one-half of the notched opening 628 upon folding, with an adjacent fin forming the other half (See FIG. 14). The notched opening edge 1307 created with this cut can be oriented at any suitable angle to a first lower edge 1363 of the unfolded fin 1319. In one embodiment, the notched opening edge 1307 is oriented at a notched opening angle 1376 greater than 90 degrees, in order to aid in formation and eventual use around a central core. In one embodiment, the notched opening angle 1376 is between about 91 and 110 degrees. In a particular embodiment, the notched opening angle 1376 is about 99 degrees.

The unfolded fin 1319 further includes an elliptical opening 1330, which helps primarily to properly arrange a series of folded fins around a central cylindrical core, although any other suitable shape can also be used, as noted above. The elliptical opening 1330 has a centerline 1320 which, in one embodiment, forms a first angle 1365 other than 90 degrees with a second lower edge 1364 of the fin. In one embodiment, the first angle 1365 is less than 90 degrees, such as between about 70 and 89 degrees. In a particular embodiment, the first angle 1365 is about 78 degrees. This second lower edge 1364 in turn is oriented at any suitable second angle 1366 to an outer fold centerline 1310 as shown. In one embodiment, the second angle 1366 is between about 70 and 89 degrees. In a particular embodiment, the second angle 1366 is about 80 degrees.

By orienting the elliptical opening 1330 in this manner, the resulting series of fins is more easily arranged around the cylindrical core. Again, in other embodiments, this angle 1365 may be more or less, as required by a particular application. Extending above and below the elliptical opening 1330 are upper and lower fold lines, 1350 and 1360, respectively, used to form the inner folded portion 630 shown in FIG. 14. The elliptical opening 1330 can have any length and width in relation to the fin length and width, and in one embodiment has the proportions discussed above for the elliptical opening 1030 in FIG. 10. FIG. 13 also shows an outer fold line 1340, which has the outer fold centerline 1310 noted above. The outer fold line 1340 is used to form the outer folded portion 626.

FIG. 14 provides an isometric view of the folded fin 619 after two folding operations have been performed to create the inner folded portion 630 and outer folded portion 626. The inner folded portion 630 is formed when the unfolded fin 1319 is folded around the elliptical centerline 1320 on the upper and lower fold lines, 1350 and 1360, respectively. The outer folded portion 626 is formed around the outer fold centerline 1310 on the outer fold line 1340. In this embodiment, the outer folded portion 626 has a variable bend radius 610.

Figure 15:
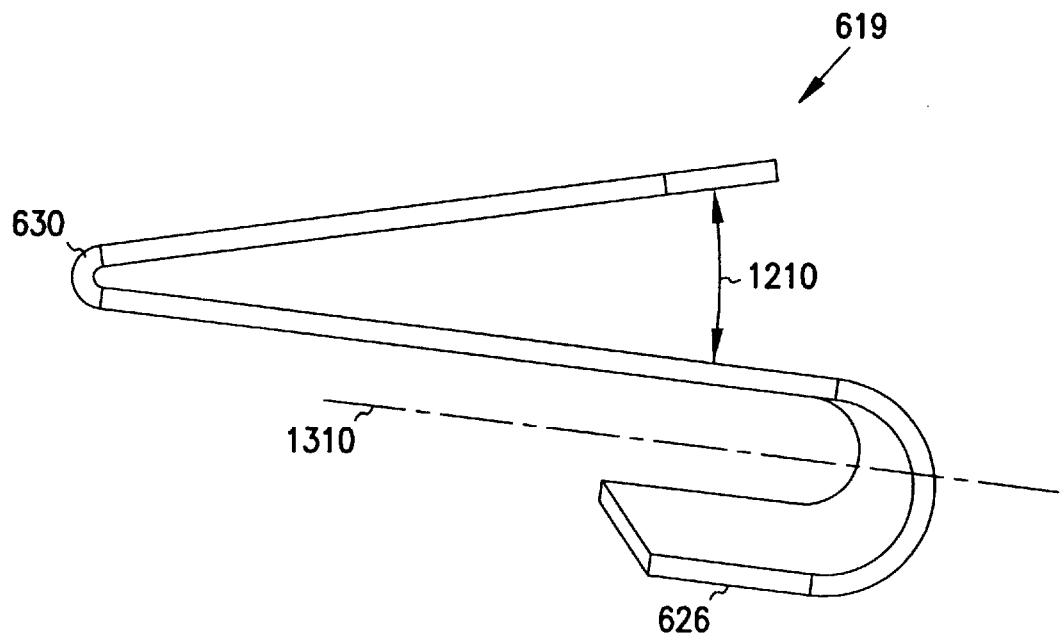
FIGS. 15 and 16 are top end views of the single folded radial fin of FIG. 14 according to the present invention.
Figure 16:
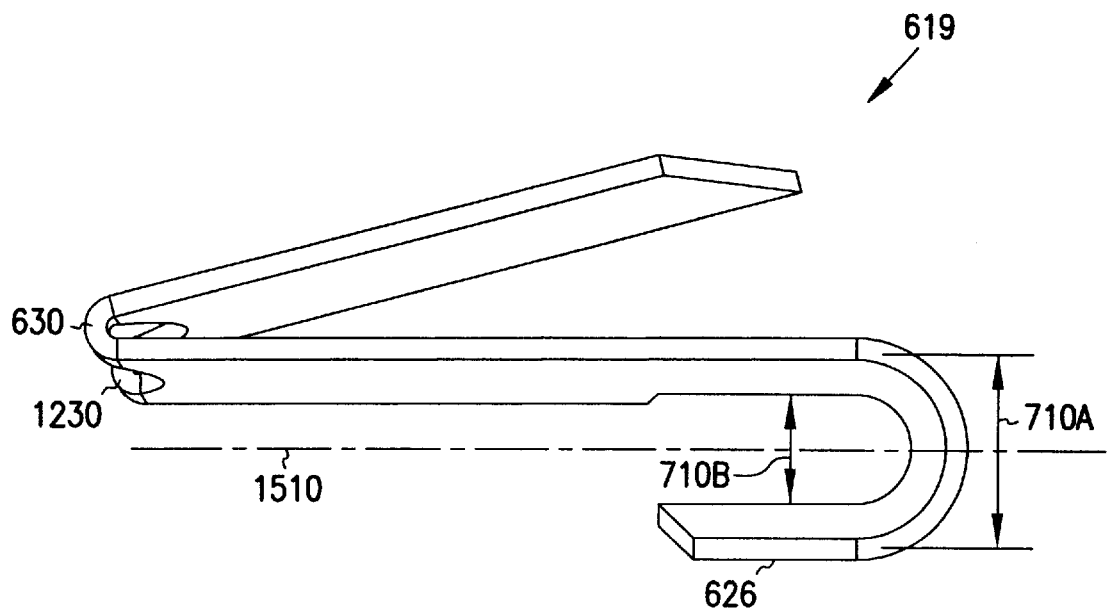

FIGS. 15 and 16 provide top end views from different perspectives, with the maximum outer bend radius 710A and minimum outer bend radius 710B, as shown. Additionally the inner angle 1210 between the inside edge of the outer fold 226 and the outside edge of the inner fold 230 can be seen in FIG. 15.

The folding operations described above can be accomplished by any suitable means, included efficient automated means. In one embodiment any suitable folding means known in the art is used to create the folds described herein. The methods described herein provide an advantage over non-automated processes for folded fins, which, in some instances, require an expensive, labor-intensive process that includes individual cutting of fins.

Figure 17:
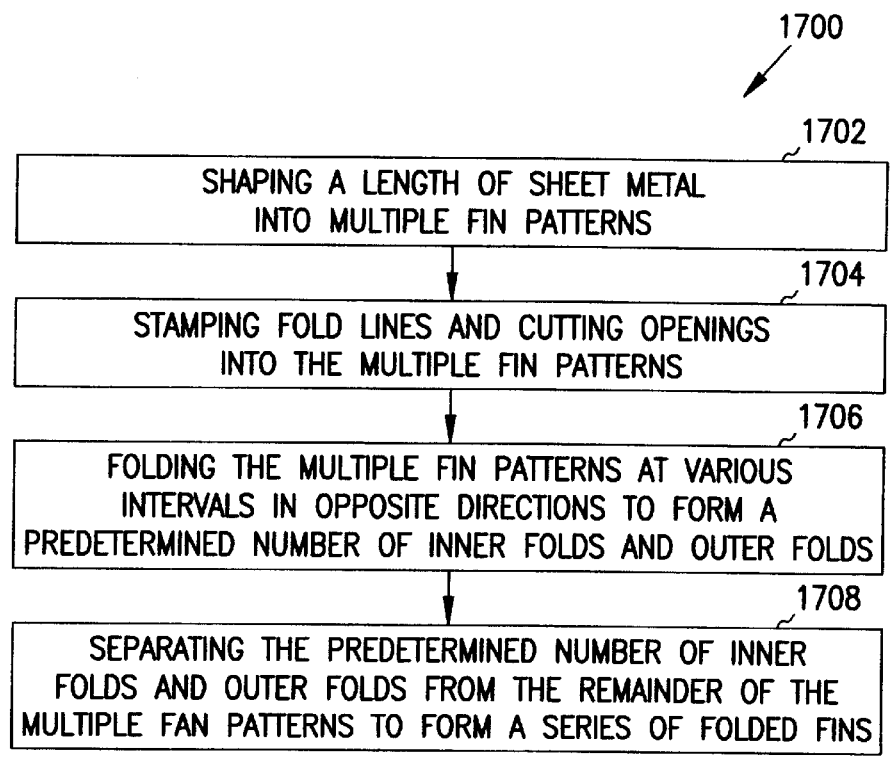
FIG. 17 is a block diagram of one exemplary method of forming a series of non-prismatic folded radial fins according to the present invention.

As shown in the block diagram of FIG. 17, in one embodiment, the process for integrally forming a series of non-prismatic radial folded fins according to the present invention begins by shaping 1702 a length of sheet metal into multiple fin patterns and stamping fold lines and cutting openings 1704 into the multiple fin patterns. The process continues by folding 1706 the multiple fin patterns at various intervals in opposite directions to form a predetermined number of inner folds and outer folds and then separating 1708 the predetermined number of inner folds and outer folds from the remainder of the multiple fan patterns to form a series of folded fins. In an alternative embodiment, the cutting step 1702 is performed after the fins are folded, rather than before.

Figure 18:
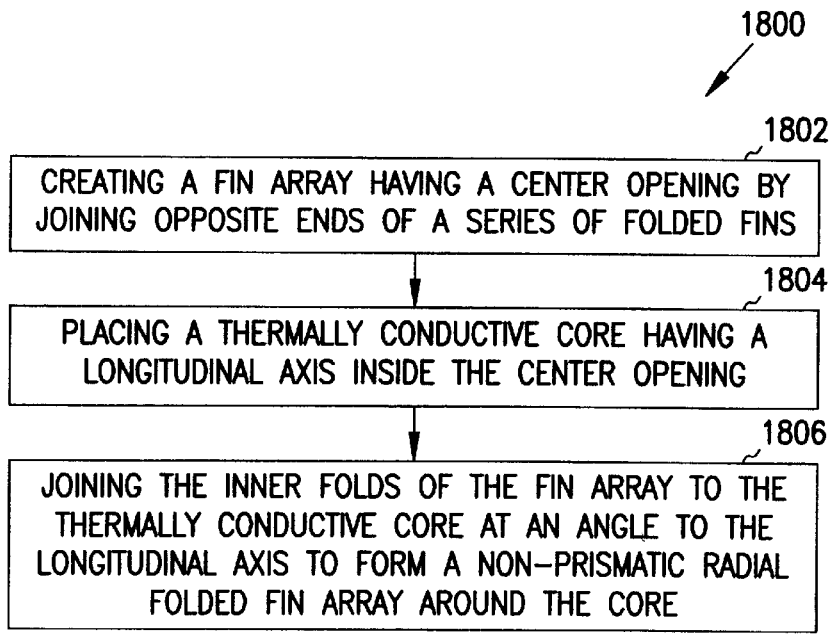
FIG. 18 is a block diagram of one exemplary method of manufacturing a non-prismatic radial folded fin heat sink according to the present invention.

As shown in the block diagram of FIG. 18, in one embodiment, the process for manufacturing a non-prismatic radial folded fin heat sink begins by creating 1802 a fin array by joining opposite ends of a series of folded fins, wherein the fin array has a center opening defined by the inner folded portions. The process continues by placing 1804 a thermally conductive core inside the center opening, the thermally conductive core having a longitudinal axis, and then joining 1806 inner folds of the fin array to the thermally conductive core at an angle to the longitudinal axis to form a non-prismatic radial folded fin array around the thermally conductive core.

Conclusion

The above-described heat sinks and methods provide, among other things, enhanced heat dissipation by using a symmetrical array of non-prismatic radially extending fin structures. The fins in this invention are folded rather than extruded and can be tilted throughout the length of the heat sink, thus improving efficiency and performance, when used in conjunction with a fan mounted above the fin array. In this way, the fin array is not only able to capture the axial and tangential components of airflow generated by the fan, but can do so in a variety of applications, as the restrictions associated with fin tilt are minimal. Additionally, multiple fin arrays can be made easily and efficient by simply folding pre-cut and pre-stamped lengths of sheet metal. The novel use of brazing as both the mechanical and thermal coupling means for the fins to the core not only provides a secure joint, but is well-adapted to automated processes. The non-prismatic radial heat sinks of the present invention can be combined with a variety of microprocessors and other high heat/low temperature electrical components to form highly efficient electronic assemblies.

While certain operations have been described herein relative to "upper" and "lower" surfaces or "top" and "bottom" surfaces, etc., it will be understood that these descriptors are relative, and that they would be reversed if the relevant structure(s) were inverted. Therefore, these terms are not intended to be limiting.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A heat sink adapted for use with an air movement device, comprising:
   a thermally conductive central cylindrical core; and
   a single non-prismatic array of folded fins coupled to the core without press-fitting, the folded fins fabricated from a length of sheet metal and adapted to intercept angled flow vectors from the air movement device.

2. The heat sink of claim 1 wherein the air movement device is an axial fan or a centrifugal fan.

3. The heat sink of claim 2 wherein the axial fan is an impinging axial fan.

4. The heat sink of claim 1 wherein each folded fin has a constant outer bend radius in an outer fold.

5. The heat sink of claim 4 wherein each folded fin has a top inner portion secured to the thermally conductive core and a top outer portion extending outwardly from the thermally conductive core, each folded fin oriented to allow a rotating fan blade to pass initially over the top inner portion prior to passing over the top outer portion.

6. The heat sink of claim 5 wherein the fan blade travels a distance of about 0.8 radians between the top inner portion and the top outer portion.

7. The heat sink of claim 1 wherein each folded fin has a variable outer bend radius in an outer fold.

8. The heat sink of claim 7 wherein each folded fin has a top inner portion secured to the thermally conductive core and a top outer portion extending outwardly from the thermally conductive core, each folded fin oriented to allow a rotating fan blade to pass over the top inner portion at about the same time that it passes over the top outer portion.

9. The heat sink of claim 1 wherein each folded fin contains an opening in a lower portion through which air can flow to prevent pressure build-up.

10. The heat sink of claim 9 wherein the opening is a notched opening contiguous with bottom edges of an outer fold.

11. The heat sink of claim 1 wherein the folded fins and thermally conductive core are both made from metallic materials.

12. The heat sink of claim 11 wherein the metallic materials are selected from the group consisting of aluminum and copper.

13. The heat sink of claim 12 wherein the thermally conductive core is made from copper and each folded fin is made from aluminum.

14. The heat sink of claim 12 wherein each folded fin is brazed to the core along an inner fold.

15. The heat sink of claim 12 wherein each folded fin further comprises an inner elliptical opening along the inner fold, further wherein each fin is brazed to the core above and below the inner elliptical opening.

16. The heat sink of claim 15 wherein the heat sink is designed to intercept tangential flow and axial flow from the impinging axial fan.

17. The heat sink of claim 16 wherein airflow from the impinging axial fan is comprised of approximately equal amounts of a tangential flow vector and an axial flow vector that form a resulting flow vector oriented at an approximately 45 degree angle to a longitudinal axis of the thermally conductive core, wherein each folded fin in the non-prismatic array of folded fins is oriented at an approximately 15 to 25 degree angle to the longitudinal axis.

18. A heat sink system comprising:
   a heat sink having a central cylindrical copper core with an outer surface; and
   a single non-prismatic array of aluminum folded fins brazed to the outer surface of the core, the folded fins fabricated from a length of sheet metal and adapted to intercept angled flow vectors.

19. The system of claim 18 wherein the array is oriented in a swept configuration around the core.

20. The system of claim 18 wherein the array is oriented in a non-swept configuration around the core.

21. The system of claim 18, further comprising:
an impinging axial fan to generate the angled flow vectors.

22. The system of claim 18 wherein the heat sink is connected to a circuit board.

23. An electronic assembly comprising:
an integrated circuit package having a top surface;
a heat sink thermally coupled to the top surface of the integrated circuit package, wherein the heat sink has a single array of non-prismatic radial folded fins fabricated from a length of sheet metal and coupled to a central cylindrical core without press-fitting; and
a circuit board located below and electrically coupled to the integrated circuit package.

24. The electronic assembly of claim 23 further comprising a cooling fan coupled to the heat sink.

25. The electronic assembly of claim 23 wherein the integrated circuit package comprises a processor circuit.

26. A method of drawing heat away from an integrated circuit comprising:
activating the integrated circuit; and
removing heat from the integrated circuit with a fan-assisted non-prismatic radial heat sink having a single array of folded fins fabricated from a length of sheet metal and coupled to a central cylindrical core without press-fitting.

27. The method of claim 26 wherein the heat sink has folded fins with a constant outer bend radius in an outer fold.

28. The method of claim 26 wherein the heat sink has folded fins with a variable outer bend radius in an outer fold.

29. The method of claim 26 wherein the fan-assisted non-prismatic radial heat sink utilizes an impinging axial fan.

30. A method for integrally forming a series of folded fins comprising:
shaping a length of sheet metal into multiple fin patterns;
stamping fold lines and cutting openings into the multiple fin patterns;
folding the multiple fin patterns at various intervals in opposite directions to form a predetermined number of inner folds and outer folds; and
separating the predetermined number of inner folds and outer folds from the remainder of the multiple fan patterns wherein a series of non-prismatic radially folded fins is formed, the folded fins designed to fit around a central cylindrical core.

31. The method of claim 30 wherein the sheet metal is aluminum.

32. The method of claim 30 wherein the outer folds have a constant bend radius or a variable bend radius.

33. The method of claim 30 wherein the inner folds each have an elliptical opening.

34. The method of claim 33 wherein the outer folds have larger radii than the inner folds.

35. The method of claim 30 wherein there are about 20 to 30 individual fins in each series of folded fins.

36. A method for manufacturing a folded fin heat sink comprising:
creating a fin array by joining opposite ends of a series of folded fins fabricated from a length of sheet metal, wherein the fin array has a center opening defined by inner folds of the fin array;
placing a thermally conductive core inside the center opening, the thermally conductive core having a longitudinal axis; and
joining the inner folds of the fin array to the thermally conductive core without press-fitting at an angle to the longitudinal axis to form a non-prismatic radial folded fin array around the thermally conductive core.

37. The method of claim 36 wherein each inner fold is brazed to the thermally conductive core in at least two locations.

38. The method of claim 37 wherein the non-prismatic fin array has a swept configuration or a non-swept configuration.

39. A method of manufacturing a heat sink comprising:
folding a single piece of sheet metal to form a series of non-prismatic radial folded fins in a single array; and
coupling the single array of folded fins to a central cylindrical core without press-fitting to form a non-prismatic radial folded fin heat sink.

40. The method of claim 39 further comprising coupling the heat sink with an integrated circuit, the integrated circuit located on an assembled system board.

41. The method of claim 39 further comprising coupling a fan to a top surface of the heat sink.

42. The heat sink of claim 11 wherein the fins are coupled to the core with soldering means.

43. The heat sink of claim 42 wherein the soldering means is either soft soldering or brazing.

44. The heat sink of claim 43 wherein each folded fin is soft soldered to the core along an inner fold.

45. A heat sink comprising:
a thermally conductive central cylindrical core; and
single non-prismatic array of folded fins coupled to the core without press-fitting, the folded fins fabricated from a length of sheet metal and adapted to intercept angled flow vectors from an impinging axial fan or a centrifugal fan, wherein each folded fin has a constant outer bend radius in an outer fold such that each folded fin has a top inner portion secured to the thermally conductive central core and a top outer portion extending outwardly from the thermally conductive central core, each folded fin oriented to allow a rotating fan blade to pass initially over the top inner portion prior to passing over the top outer portion, further wherein each folded fin contains an opening in a lower portion through which air can flow to prevent pressure build-up.

46. The heat sink of claim 45 wherein the fan blade travels a distance of about 0.8 radians between the top inner portion and the top outer portion.

47. The heat sink of claim 45 wherein the opening is a notched opening contiguous with bottom edges of an outer fold.

48. A heat sink comprising:
a thermally conductive central cylindrical core; and
a single non-prismatic array of folded fins coupled to the core without press-fitting, the folded fins fabricated from a length of sheet metal and adapted to intercept angled flow vectors from an impinging axial fan or a centrifugal fan, wherein each folded fin has a variable outer bend radius in an outer fold such that each folded fin has a top inner portion secured to the thermally conductive central core and a top outer portion extending outwardly from the thermally conductive central core, each folded fin oriented to allow a rotating fan blade to pass over the top inner portion at about the same time that it passes over the top outer portion, further wherein each folded fin contains an opening in a lower portion through which air can flow to prevent pressure build-up.

49. The heat sink of claim 48 wherein the fan blade travels a distance of about 0.8 radians between the top inner portion and the top outer portion.

50. The heat sink of claim 48 wherein the opening is a notched opening contiguous with bottom edges of an outer fold.

51. A heat sink comprising:
   a thermally conductive metallic central cylindrical core; and
   a single non-prismatic array of metallic folded fins having an inner elliptical opening along an inner fold, the fins brazed to the core above and below the inner elliptical opening, the folded fins fabricated from a length of sheet metal and adapted to intercept tangential flow and axial flow from an impinging axial fan, wherein airflow from the impinging axial fan is comprised of approximately equal amounts of a tangential flow vector and an axial flow vector that form a resulting flow vector oriented at an approximately 45 degree angle to a longitudinal axis of the core, wherein each folded fin in the single non-prismatic array of metallic folded fins is oriented at an approximately 15 to 25 degree angle to the longitudinal axis.

52. The heat sink of claim 51 wherein the metallic materials are selected from the group consisting of aluminum and copper.

53. The heat sink of claim 52 wherein the core is made from copper and each folded fin is made from aluminum.

54. A method for integrally forming a series of folded fins comprising:
   shaping a length of sheet metal into multiple fin patterns;
   stamping fold lines and cutting openings into the multiple fin patterns;
   folding the multiple fin patterns at various intervals in opposite directions to form a predetermined number of inner folds and outer folds, wherein the inner folds have an elliptical opening and the outer folds have a constant bend radius or a variable bend radius, the outer folds having a larger radii than the inner folds; and
   separating the predetermined number of inner folds and outer folds from the remainder of the multiple fan patterns wherein a series of non-prismatic radially folded fins is formed, the folded fins fabricated from a single sheet and designed to fit around a central cylindrical core.

55. The method of claim 54 wherein there are about 20 to 30 individual fins in each series of folded fins.

56. The method of claim 54 wherein the sheet metal is aluminum.

57. A method for manufacturing a folded fin heat sink comprising:
   creating a fin array by joining opposite ends of a series of folded fins fabricated from a single piece of sheet metal, wherein the fin array has a center opening defined by inner folds of the fin array;
   placing a thermally conductive core inside the center opening, the thermally conductive core having a longitudinal axis; and
   soldering the inner folds of the fin array to the thermally conductive core in at least two locations and at an angle to the longitudinal axis to form a non-prismatic radial folded fin array around the thermally conductive core, wherein the non-prismatic fin array has a swept configuration or a non-swept configuration.

58. The method of claim 57 wherein the inner folds are soldered to the thermally conductive core.

59. The method of claim 57 wherein the sheet metal is aluminum.

* * * * *

UNITED STATES PATENT AND TRADEMARK OFFICE
CERTIFICATE OF CORRECTION

PATENT NO. : 6,657,862 B2
DATED : December 2, 2003
INVENTOR(S) : Crocker et al.

It is certified that error appears in the above-identified patent and that said Letters Patent is hereby corrected as shown below:

Column 16,
Line 40, delete "claim 12" and insert -- claim 43 --, therefor.
Line 42, delete "claim 12" and insert -- claim 14 --, therefor.

Column 18,
Line 30, insert -- a -- before "single".

Signed and Sealed this

Twenty-seventh Day of July, 2004

JON W. DUDAS
*Acting Director of the United States Patent and Trademark Office*